US012642075B2

(12) United States Patent
Lee et al.

(10) Patent No.: US 12,642,075 B2
(45) Date of Patent: May 26, 2026

(54) MANUFACTURING METHOD OF SEMICONDUCTOR DEVICE WITH DUAL SLIT AND CONTACT PLUG STRUCTURE

(71) Applicant: SK hynix Inc., Icheon-si (KR)

(72) Inventors: Sang Yong Lee, Icheon-si (KR); Sae Jun Kwon, Icheon-si (KR); Sang Min Kim, Icheon-si (KR); Jin Taek Park, Icheon-si (KR); Sang Hyun Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/598,129

(22) Filed: Mar. 7, 2024

(65) Prior Publication Data

US 2024/0213149 A1 Jun. 27, 2024

Related U.S. Application Data

(63) Continuation of application No. 16/917,410, filed on Jun. 30, 2020, now Pat. No. 12,014,978.

(30) Foreign Application Priority Data

Jan. 3, 2020 (KR) ........................ 10-2020-0001001

(51) Int. Cl.
*H10B 43/27* (2023.01)
*H01L 23/48* (2006.01)
(Continued)

(52) U.S. Cl.
CPC ........ *H01L 23/5226* (2013.01); *H01L 23/481* (2013.01); *H10B 41/10* (2023.02);
(Continued)

(58) Field of Classification Search
CPC ........ H10B 41/10; H10B 41/27; H10B 41/35; H10B 43/10; H10B 43/27; H10B 43/35;
(Continued)

(56) References Cited

U.S. PATENT DOCUMENTS 9,449,986 B1 9/2016 Yoon et al.
10,049,743 B2 * 8/2018 Lee ........................ G11C 16/26
(Continued)

FOREIGN PATENT DOCUMENTS

CN 106856198 A 6/2017
JP 2012094694 A 5/2012
(Continued)

*Primary Examiner* — Ajay Ojha
*Assistant Examiner* — Tsz K Chiu
(74) *Attorney, Agent, or Firm* — WILLIAM PARK AND ASSOCIATES LTD.

(57) ABSTRACT

A semiconductor device includes a line; a source structure on the line; a stack structure on the source structure; a first slit structure penetrating the stack structure; a second slit structure penetrating the stack structure; and a contact plug adjacent to the first slit structure in a first direction. The first slit structure and the second slit structure may be spaced apart from each other by a first distance in a second direction that is perpendicular to the first direction. The contact plug penetrates the source structure, the contact plug being electrically connected to the lower line. The first slit structure and the contact plug may be spaced apart from each other by a second distance in the first direction, and the second distance may be longer than the first distance.

13 Claims, 34 Drawing Sheets

(51) Int. Cl.

| | |
|---|---|
| *H01L 23/522* | (2006.01) |
| *H01L 23/528* | (2006.01) |
| *H10B 41/10* | (2023.01) |
| *H10B 41/27* | (2023.01) |
| *H10B 41/35* | (2023.01) |
| *H10B 43/10* | (2023.01) |
| *H10B 43/35* | (2023.01) |

(52) U.S. Cl.
CPC ............. *H10B 41/27* (2023.02); *H10B 41/35* (2023.02); *H10B 43/10* (2023.02); *H10B 43/27* (2023.02); *H10B 43/35* (2023.02)

(58) Field of Classification Search
CPC ........ H10B 43/50; H10B 43/40; H10B 20/40; H10B 20/50; H10B 41/20; H10B 43/20; H10B 43/23; H10B 51/20; H10B 63/84; H10B 63/845; H10B 41/41; H10B 41/50; H10B 41/40; H10B 80/00; H10B 41/42; H10B 43/30; H10B 41/30; H10B 69/00; H10B 63/34; H10B 12/03; H10B 12/30; H10B 10/00; H10B 12/50; H10B 10/18; H10B 12/0335; H10B 63/30; H10B 12/033; H10B 12/056; H10B 12/36; H10B 12/482; H10B 12/485; H10B 12/488; H10B 41/23; H10B 12/09; H10B 41/46; H10B 51/10; H10B 51/50; H10B 53/20; H10B 12/036; H10B 12/315; H10B 20/60; H10B 99/14; H10B 99/22; H01L 23/5226; H01L 23/481; H01L 23/528; H01L 23/5283; H01L 21/76877; H01L 25/18; H01L 2224/08145; H01L 24/08; H01L 25/0657; H01L 21/76816; H01L 23/535; H01L 21/76805; H01L 2224/80895; H01L 2224/80896; H01L 25/50; H01L 2924/1431; H01L 21/31111; H01L 21/76802; H01L 21/76831; H01L 21/02164; H01L 2924/14511; H01L 24/80; H01L 2225/06541; H01L 2924/0002; H01L 2225/06506; H01L 21/31116; H01L 21/76834; H01L 21/76895; H01L 21/76897; H01L 2224/32145; H01L 2224/80357; H01L 23/53295; H01L 21/0228; H01L 2225/0651; H01L 2225/06524; H01L 2225/06562; H01L 23/562; H01L 25/0652; H01L 21/31144; H01L 23/53271; H01L 21/0217; H01L 21/32134; H01L 21/022; H01L 21/76843; H01L 2224/48145; H01L 2224/73265; H01L 2224/48227; H01L 2225/06586; H01L 23/5223; H01L 23/5329; H01L 21/28247; H01L 21/31053; H01L 2224/08146; H01L 2224/32225; H01L 2224/80097; H01L 23/485; H01L 23/544; H01L 2924/15311; H01L 2924/181; H01L 21/02019; H01L 21/02178; H01L 21/02236; H01L 21/02326; H01L 21/02636; H01L 21/02697; H01L 21/28568; H01L 21/308; H01L 21/32138; H01L 21/32139; H01L 21/762; H01L 21/76237; H01L 21/76294; H01L 21/764; H01L 21/7682; H01L 21/76829; H01L 21/76832; H01L 21/76837; H01L 21/76871; H01L 2223/54426; H01L 2223/54453; H01L 2224/05099; H01L 2224/05599; H01L 2224/08225; H01L 2224/29138; H01L 2224/29186; H01L 2224/80031; H01L 2224/80039; H01L 2224/80048; H01L 2224/83896; H01L 2225/06565; H01L 2225/06589; H01L 23/498; H01L 23/5384; H01L 23/5386; H01L 24/05; H01L 25/162; H01L 2924/1434; H01L 2924/30101; H01L 21/0337; H01L 21/486; H01L 23/585; H01L 24/33; H01L 25/105; H01L 21/02112; H01L 21/0223; H01L 21/02356; H01L 21/02532; H01L 21/0254; H01L 21/02554; H01L 21/02595; H01L 21/02603; H01L 21/02639; H01L 21/28518; H01L 21/31; H01L 21/31122; H01L 21/768; H01L 21/76841; H01L 21/76855; H01L 21/76879; H01L 21/76883; H01L 22/32; H01L 2224/02331; H01L 2224/0235; H01L 2224/02351; H01L 2224/05547; H01L 2224/05548; H01L 2224/05556; H01L 2224/08058; H01L 2224/73215; H01L 2224/80009; H01L 2225/06513; H01L 2225/06548; H01L 2225/06558; H01L 2225/06568; H01L 2225/1023; H01L 2225/1052; H01L 23/3171; H01L 23/4824; H01L 23/53209; H01L 23/53257; H01L 24/82; H01L 2924/1436; H01L 2924/1438; H01L 21/28114; H01L 21/3083; H01L 21/4846; H01L 21/76885; H01L 21/76892; H01L 21/78; H01L 22/34; H01L 2224/08148; H01L 2224/48091; H01L 2224/80006; H01L 2224/83191; H01L 23/3128; H01L 23/3135; H01L 23/49548; H01L 23/5228; H01L 23/53266; H01L 23/564; H01L 23/60; H01L 2924/00; H01L 2924/00014; H10D 30/69

See application file for complete search history.

(56) References Cited

U.S. PATENT DOCUMENTS

| | | | | |
|---|---|---|---|---|
| 10,163,924 B2 * | 12/2018 | Ahn | ....................... | H10B 41/27 |
| 10,224,340 B2 | 3/2019 | Hada et al. | | |
| 10,263,010 B2 * | 4/2019 | Choi | ................ | H01L 29/66833 |
| 10,283,493 B1 | 5/2019 | Nishida | | |
| 10,283,514 B2 * | 5/2019 | Lee | ......................... | H10B 43/10 |
| 10,381,375 B2 | 8/2019 | Choi | | |
| 10,396,088 B2 | 8/2019 | Lee et al. | | |
| 10,510,770 B2 * | 12/2019 | Harada | ................. | H01L 23/528 |
| 10,566,335 B2 * | 2/2020 | Lee | ......................... | H10B 43/27 |
| 10,644,022 B2 | 5/2020 | Choi | | |
| 10,665,581 B1 | 5/2020 | Zhou et al. | | |
| 10,770,475 B2 | 9/2020 | Choi | | |
| 10,854,619 B2 | 12/2020 | Chibvongodze et al. | | |
| 10,861,866 B2 * | 12/2020 | Choi | ...................... | H10B 43/35 |
| 10,930,661 B2 * | 2/2021 | Chen | ..................... | H10B 43/35 |
| 10,930,665 B2 | 2/2021 | Horibe et al. | | |
| 10,930,667 B2 * | 2/2021 | Ahn | ....................... | H10B 43/27 |
| 10,950,613 B2 * | 3/2021 | Lee | ......................... | H10B 41/27 |
| 11,011,209 B2 | 5/2021 | Kim et al. | | |
| 11,600,632 B2 | 3/2023 | Cheon et al. | | |
| 2011/0180866 A1 | 7/2011 | Matsuda et al. | | |
| 2011/0215390 A1 * | 9/2011 | Kim | ........................ | H10D 8/00 |
| | | | | 257/532 |
| 2015/0041903 A1 | 2/2015 | Oh et al. | | |
| 2016/0351581 A1 * | 12/2016 | Ahn | ....................... | H10B 43/40 |
| 2017/0207226 A1 | 7/2017 | Lee | | |

(56) References Cited

U.S. PATENT DOCUMENTS

| | | | |
|---|---|---|---|
| 2017/0221756 A1 | 8/2017 | Tsutsumi et al. | |
| 2017/0338241 A1 | 11/2017 | Lee | |
| 2018/0076213 A1 | 3/2018 | Kaneko et al. | |
| 2018/0342455 A1 | 11/2018 | Nosho et al. | |
| 2019/0333931 A1* | 10/2019 | Jung ..................... | H10B 41/41 |
| 2020/0006299 A1 | 1/2020 | Liu et al. | |
| 2020/0144242 A1 | 5/2020 | Park | |
| 2020/0343235 A1 | 10/2020 | Zhang et al. | |
| 2021/0091113 A1 | 3/2021 | Kim et al. | |
| 2022/0093629 A1 | 3/2022 | Kim et al. | |

FOREIGN PATENT DOCUMENTS

| | | |
|---|---|---|
| KR | 1020170053478 A | 5/2017 |
| KR | 1020190051651 A | 5/2019 |

* cited by examiner

SLI3

SLI2

ST

SLI1

CH

SLI2

MANUFACTURING METHOD OF SEMICONDUCTOR DEVICE WITH DUAL SLIT AND CONTACT PLUG STRUCTURE

CROSS-REFERENCE TO RELATED APPLICATION

The present application is a continuation application of U.S. patent application Ser. No. 16/917,410, filed on Jun. 30, 2020, and claims priority under 35 U.S.C. § 119(a) to Korean patent application number 10-2020-0001001, filed on Jan. 3, 2020, in the Korean Intellectual Property Office, the entire disclosure of which are incorporated herein by reference.

BACKGROUND

1. Technical Field

The present disclosure generally relates to an electronic device, and more particularly, to a semiconductor device and a manufacturing method thereof.

2. Related Art

A nonvolatile memory device is a memory device in which stored data is maintained even when the supply of power is interrupted. As the improvement of the degree of integration of two-dimensional nonvolatile memory devices, formed over a semiconductor substrate in the form of a single layer, has reached a limit of sorts, a three-dimensional nonvolatile memory device has been proposed in which memory cells are formed in a vertical direction over a semiconductor substrate.

The three-dimensional memory device includes interlayer insulating layers and gate electrodes, which are stacked in an alternating manner, and channel layers that penetrate the interlayer insulating layers and the gate electrodes, and memory cells that are stacked along the channel layers. Various structures and manufacturing methods have been developed so as to improve the operational reliability of the three-dimensional nonvolatile memory device.

SUMMARY

In accordance with an aspect of the present disclosure, there is provided a semiconductor device including: a line; a source structure on the line; a stack structure on the source structure; a first slit structure penetrating the stack structure; and a contact plug adjacent to the first slit structure in a first direction; a second slit structure penetrating the stack structure, the second slit structure being adjacent to the first slit structure in a second direction intersecting the first direction, wherein the contact plug penetrating the source structure, the contact plug being electrically connected to the lower line, wherein the first slit structure and the second slit structure are spaced apart from each other by a first distance in second direction, the first slit structure and the contact plug are spaced apart from each other by a second distance in the first direction, and the second distance is longer than the first distance.

In accordance with another aspect of the present disclosure, there is provided a semiconductor device including: a line; a source structure on the line; a stack structure on the source structure; a contact plug penetrating the source structure; and a first slit structure including a first penetration part that penetrates the stack structure and a first protrusion part that protrudes inwardly, through the source structure, towards the contact plug from a sidewall of the first penetration part, wherein the contact plug is electrically connected to the lower line and is spaced apart from the first protrusion part.

In accordance with still another aspect of the present disclosure, there is provided a method of manufacturing a semiconductor device, the method including: forming a line; forming a source structure on the line, wherein the source structure includes a sacrificial layer and a first source layer; forming a contact plug that penetrates the source structure, the contact plug being electrically connected to the line; forming a stack structure on the source structure; forming a first slit that penetrates the stack structure; forming a second slit that penetrates the stack structure; and replacing the sacrificial layer with a second source layer through the first slit, wherein the first slit and the second slit are spaced apart from each other by a first distance, the first slit and the contact plug are spaced apart from each other by a second distance, and wherein the second distance is longer than the first distance.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 2A to 2C are views, illustrating a structure of a semiconductor device, in accordance with an embodiment of the present disclosure.

FIGS. 4A to 4B, 5A to 5B, 6A to 6C, 7A to 7C, 8A to 8C, 9A to 9C, and 10A to 10C are views, illustrating a manufacturing method of a semiconductor device, in accordance with an embodiment of the present disclosure.

FIGS. 11A to 11E are views, illustrating a manufacturing method of a semiconductor device, in accordance with an embodiment of the present disclosure.

FIGS. 12A to 12F are views, illustrating a manufacturing method of a semiconductor device, in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments provide a semiconductor device having a stable structure and improved characteristics, and a manufacturing method of the semiconductor device.

Figure 1A:
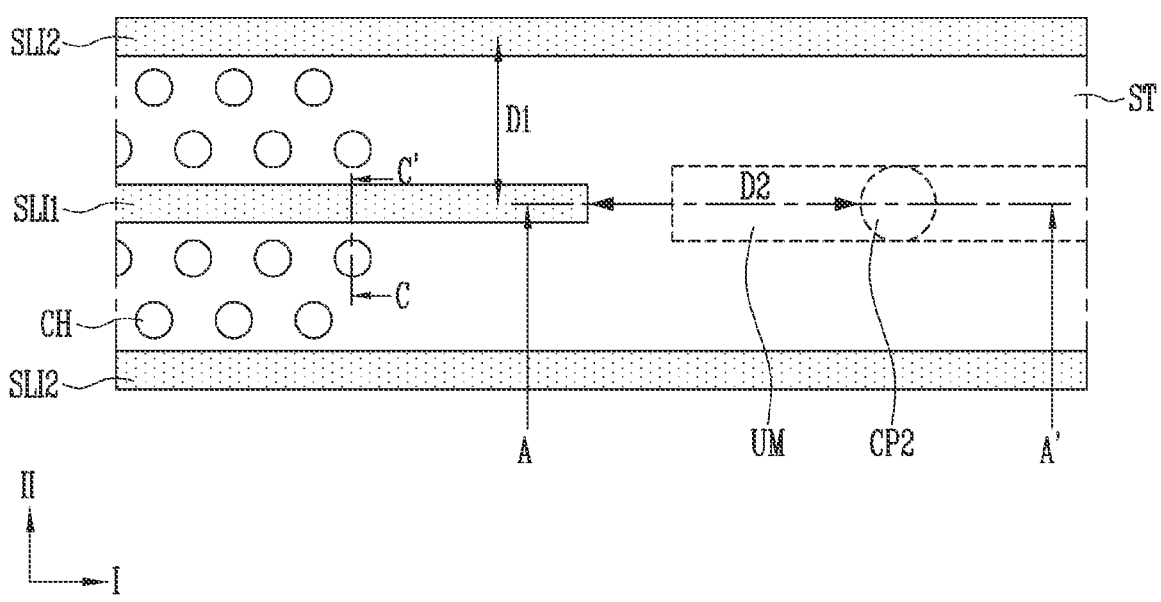
FIGS. 1A to 1D are views, illustrating a structure of a semiconductor device, in accordance with an embodiment of the present disclosure.
Figure 1B:
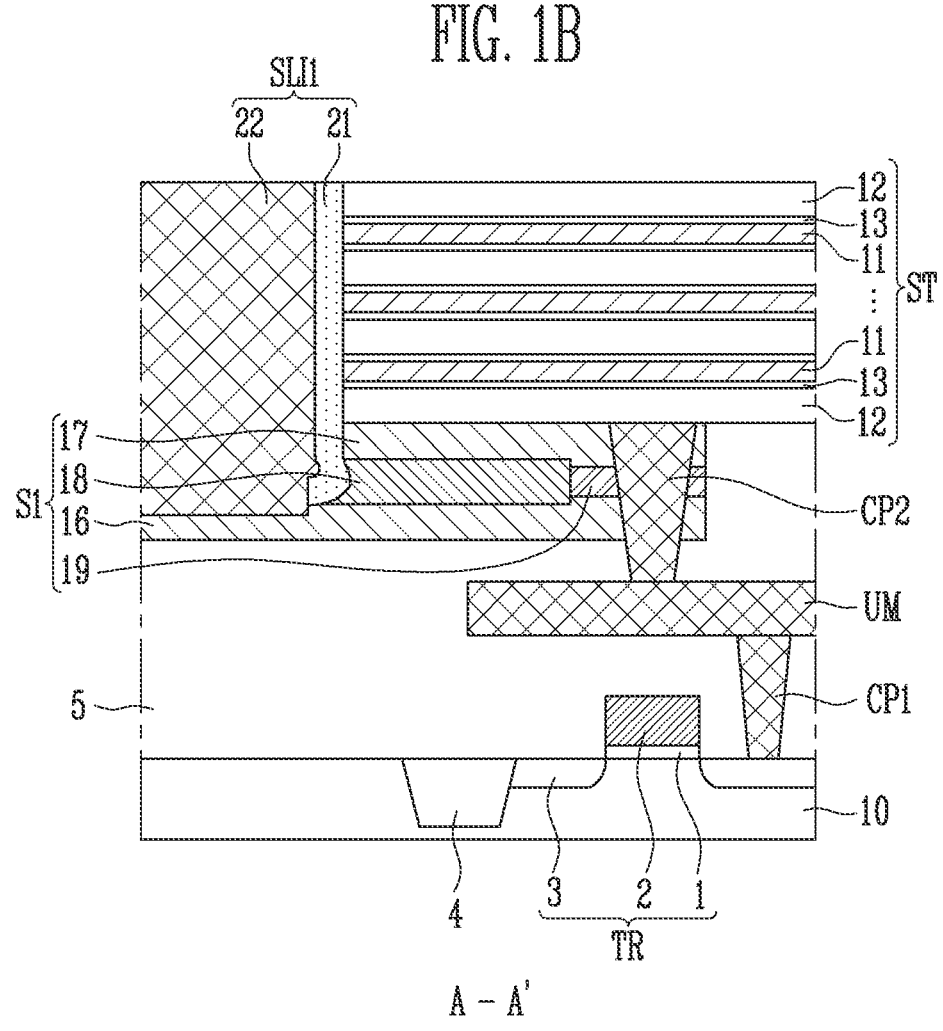
Figure 1C:
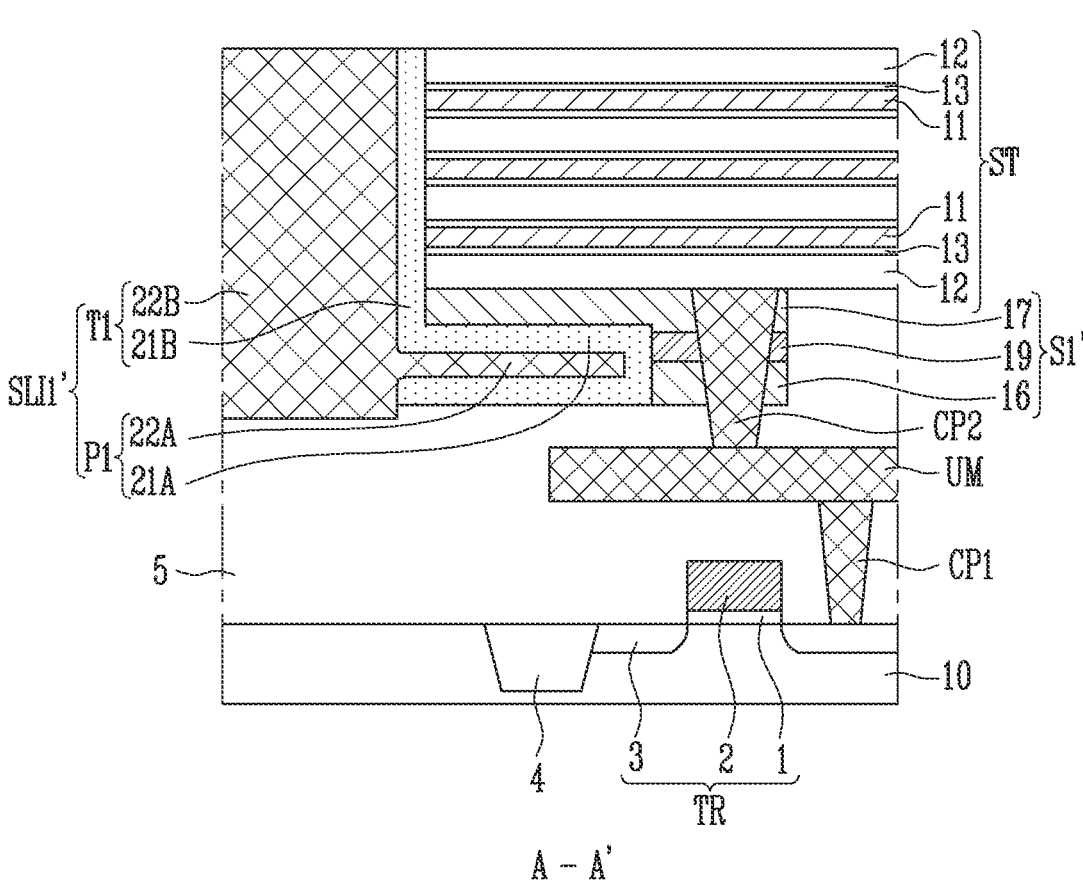
Figure 1D:
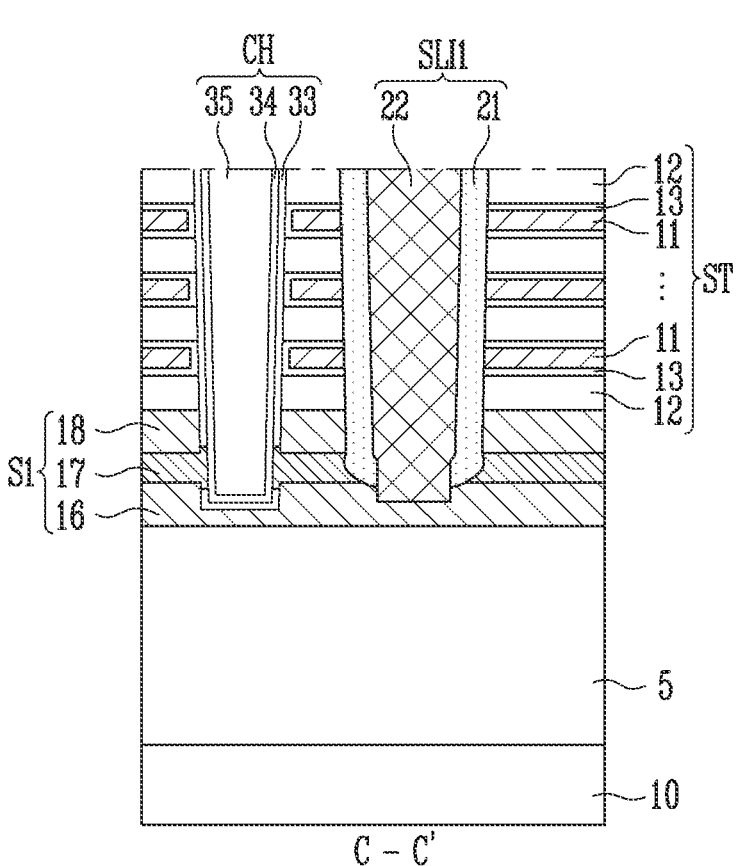

FIGS. 1A to 1D are views, illustrating a structure of a semiconductor device, in accordance with an embodiment of the present disclosure. FIG. 1A is a plan view, FIGS. 1B and 1C are sectional views that are taken along the line A-A', shown in FIG. 1A, and FIG. 1D is a sectional view that is taken along the line C-C', shown in FIG. 1A.

Referring to FIGS. 1A, 1B, and 1D, the semiconductor device may include a source structure S1, a stack structure ST, a first slit structure SLI1, and a second contact plug CP2. Also, the semiconductor device may further include at least one of a line UM, a second slit structure SLI2, a first contact plug CP1, a channel structure CH, a substrate 10, a transistor TR, and an interlayer insulating layer 5.

The stack structure ST may include conductive layers 11 and insulating layers 12, which are stacked in an alternating manner. The conductive layers 11 may be a word line, a select line, or the like. The conductive layers 11 may include poly-silicon, include a metal such as tungsten, or include a combination thereof. The insulating layers 12 may be used to insulate the conductive layers 11 from each other. The insulating layers 12 may include an insulating material, such as an oxide or a nitride. Also, the stack structure ST may further include a memory layer 13, interposed between the conductive layers 11 and the insulating layers 12. The memory layer 13 may include at least one of a tunnel insulating layer, a data storage layer, and a blocking layer. The tunnel insulating layer may be a layer through which charges tunnel via F-N tunneling. The data storage layer may include a floating gate, a charge trap material, a nitride, a nano structure, a variable resistance material, a phase change material, and the like. The blocking layer may be a charge blocking layer that is capable of preventing the movement of charges and may include a high dielectric constant material, such as $Al_2O_3$.

The first slit structure SLI1 may penetrate the stack structure ST and may extend in a first direction I. The second slit structure SLI2 may penetrate the stack structure ST and may extend in the first direction I. The first slit structure SLI1 and the second slit structure SLI2 may be adjacent to each other in a second direction II. The first slit structure SLI1 may be located between two second slit structures SLI2 that are adjacent to each other in the second direction II. The second direction II may be a direction intersecting the first direction I. The second direction II may be a direction that is perpendicular to the first direction I.

The first slit structure SLI1 or the second slit structures SLI2 may include an insulating material, such as an oxide or a nitride. Also, the first slit structure SLI1 or the second slit structures SLI2 may include a source contact structure 22 that is electrically connected to the source structure S1. For example, the first slit structure SLI1 may include the source contact structure 22 and an insulating spacer 21, the insulating spacer 21 being formed on a sidewall of the source contact structure 22. The insulating spacer 21 may insulate the source contact structure 22 and the conductive layers 11 from each other.

The channel structure CH may penetrate the stack structure ST and may be connected to the source structure S1. The channel structure CH may be located between the first slit structure SLI1 and the second slit structure SLI2. The channel structure CH may include a channel layer 34, a memory layer 33, a gap fill layer 35, and the like. The memory layer 33 may include at least one of a tunnel insulating layer, a data storage layer, and a blocking layer. The data storage layer may include a floating gate, a charge trap material, a nitride, a nano structure, a variable resistance material, a phase change material, and the like.

A memory cell, a select transistor, and the like may be located where the channel structure CH and the conductive layers 11 intersect each other. Memory cells and select transistors, which share the channel structure CH, may constitute one memory string. For example, the memory string may include at least one drain select transistor, a plurality of memory cells, and at least one source select transistor.

The source structure S1 may be located over the line UM. The line UM may include a conductive material, such as a metal. The source structure S1 may be located between the substrate 10 and the stack structure ST. The source structure S1 may be a single layer or a multi-layer. The source structure S1 may include a third source layer 18 and may further include a first source layer 16 and a second source layer 17. The third source layer 18 may be interposed between the first source layer 16 and the second source layer 17. Also, the source structure S1 may further include a sacrificial layer 19 that is interposed between the first source layer 16 and the second source layer 17. The source structure S1 may include poly-silicon, a metal such as tungsten, or a combination thereof.

The first slit structure SLI1 or the second slit structure SLI2 may penetrate the stack structure ST and may extend to the inside of the source structure S1. For example, the first slit structure SLI1 or the second slit structure SLI2 may penetrate the second source layer 17 and the third source layer 18. The first slit structure SLI1 or the second slit structure SLI2 may be in contact with the first source layer 16.

The second contact plug CP2 may electrically connect the line UM and the source structure S1. The second contact plug CP2 may be located between the stack structure ST and the line UM. The second contact plug CP2 may penetrate the source structure S1 and may be in contact with the source structure S1. The source structure S1 may be electrically connected to the substrate 10 through the second contact plug CP2, the line UM, and the first contact plug CP1.

The second contact plug CP2 may penetrate the second source layer 17, the sacrificial layer 19, and the first source layer 16. The second contact plug CP2 may be located to be spaced apart from the third source layer 18, and the sacrificial layer 19 may be interposed between the second contact plug CP2 and the third source layer 18.

The second contact plug CP2 may be located to be spaced apart from the first slit structure SLI1 in the first direction I. On a plane that is defined by the first direction I and the second direction II, the first slit structure SLI1 and the second slit structure SLI2 may be located to be spaced apart from each other by a first distance D1 in the second direction II. The first distance D1 may be a distance from the center of the first slit structure SLI1 to the center of the second slit structure SLI2 or may be a distance from an edge of the first slit structure SLI1 to an edge of the second slit structure SLI2. On the plane, the first slit structure SLI1 and the second contact plug CP2 may be spaced apart from each other by a second distance D2 in the first direction I. The second distance D2 may be a distance from an edge of the first slit structure SLI1 to an edge of the second contact plug CP2. The second distance D2 may be longer than the first distance D1. The second distance D2 may be twice as long as or more than twice as long as the first distance D1.

The interlayer insulating layer 5 may be interposed between the substrate 10 and the source structure S1. A peripheral circuit and an interconnection structure, electrically connected to the peripheral circuit, may be located in the interlayer insulating layer 5. The peripheral circuit may be used to drive the memory string and may be located on the substrate 10. The peripheral circuit may include the transistor TR, a capacitor, a resistor, an amplifier, a decoder, a voltage generator, and the like. The transistor TR may include a gate insulating layer 1 and a gate electrode 2. A junction 3 may be formed in the substrate 10 at both sides of the gate electrode 2. In addition, an isolation layer 4 may be formed in the substrate 10.

The interconnection structure may include at least one of the second contact plug CP2, the line UM, and the first contact plug CP1. The first contact plug CP1 may be located between the substrate 10 and the line UM. The first contact plug CP1 may be electrically connected to the peripheral circuit or may be electrically connected to the junction 3 of the substrate 10.

The second contact plug CP2 may be a discharge contact plug. Charges that exist in the source structure S1 may be discharged to the substrate 10 through the second contact plug CP2, the line UM, and the first contact plug CP1. Therefore, charges might not accumulate in the source structure, and the semiconductor device may avoid being damaged due to accumulated charges.

FIG. 1C is similar to FIG. 1B and illustrates a case where a first slit structure SLI1' includes a first protrusion part P1. Referring to FIGS. 1A and 1C, the first slit structure SLI1' may include a first penetration part T1 and the first protrusion part P1. The first penetration part T1 may penetrate the stack structure ST and a source structure S1'. The first protrusion part P1 may protrude inwardly, through the source structure S1', towards the second contact plug CP2 from a sidewall of the first penetration part T1. The second contact plug CP2 may be spaced apart from the first protrusion part P1. The sacrificial layer 19 and the first source layer 16 may be interposed between the second contact plug CP2 and the first protrusion part P1. Although not shown in the drawing, the first slit structure SL1' may include a void that is located in the first protrusion part P1.

The first slit structure SLI1' may include an insulating spacer and a source contact structure. The insulating spacer may include a penetration part 21B and a protrusion part 21A, the protrusion part 21A protruding inwardly from a sidewall of the penetration 21B. The source contact structure may include a penetration part 22B and a protrusion part 22A, the protrusion part 22A protruding inwardly from a sidewall of the penetration part 22B. Although not shown in the drawing, the first slit structure SLI1' may include a void that is located in the protruding part 22A.

According to the structure described above, the second contact plug CP2 may be located to be sufficiently spaced apart from the first slit structure SLI1 or the first protrusion part P1 of the first slit structure SLI1'. Thus, the second contact plug CP2 may avoid being exposed or damaged in a manufacturing process of the semiconductor device.

Figure 2A:
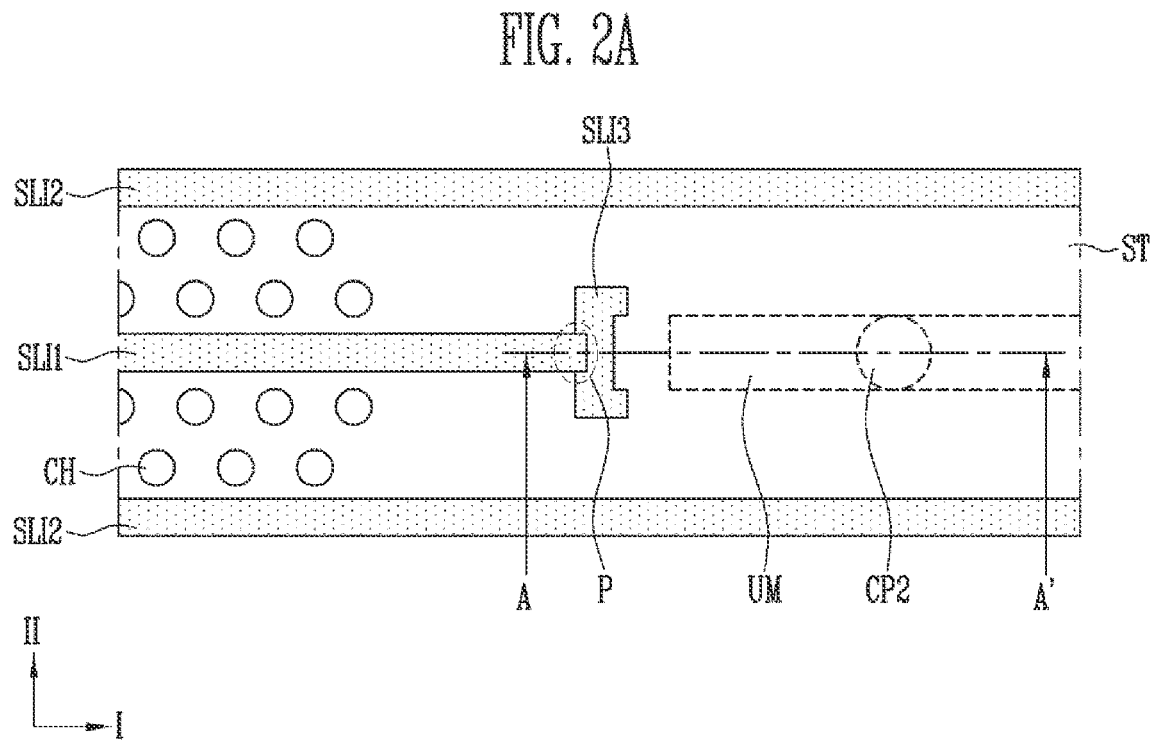
Figure 2B:
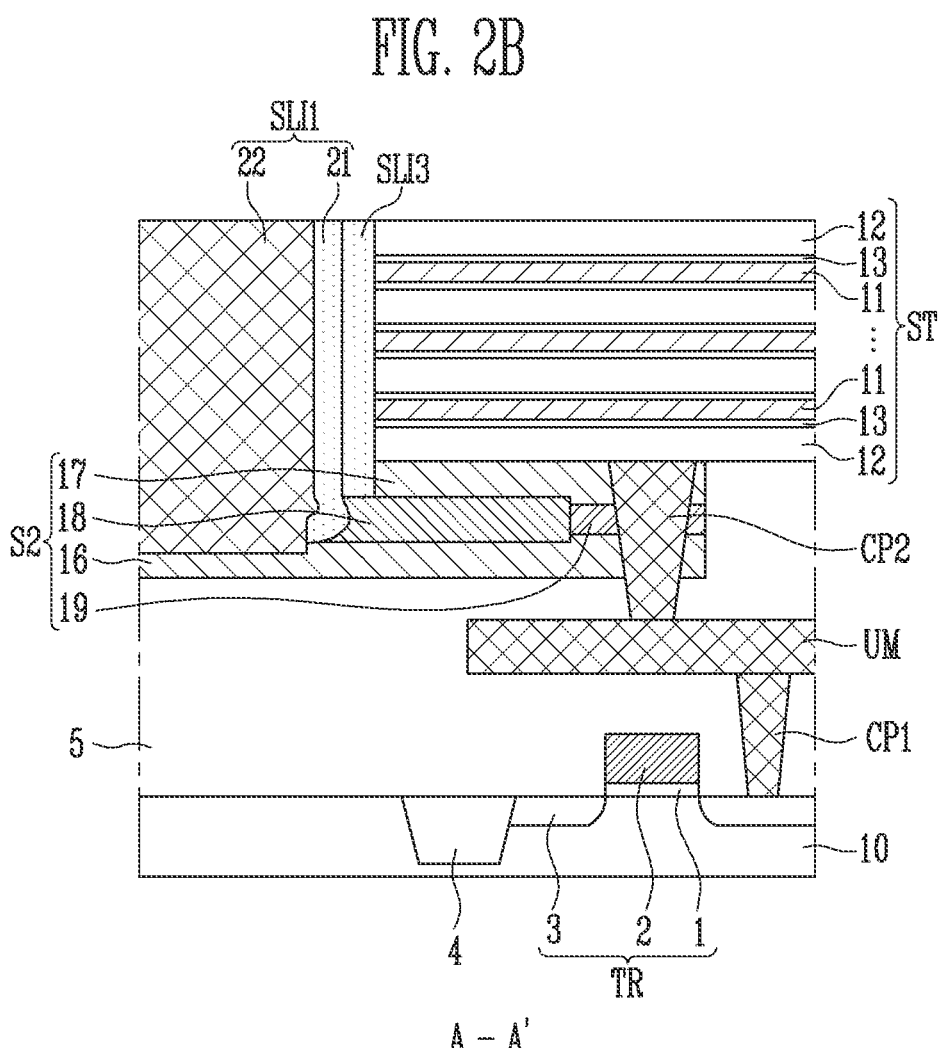
Figure 2C:
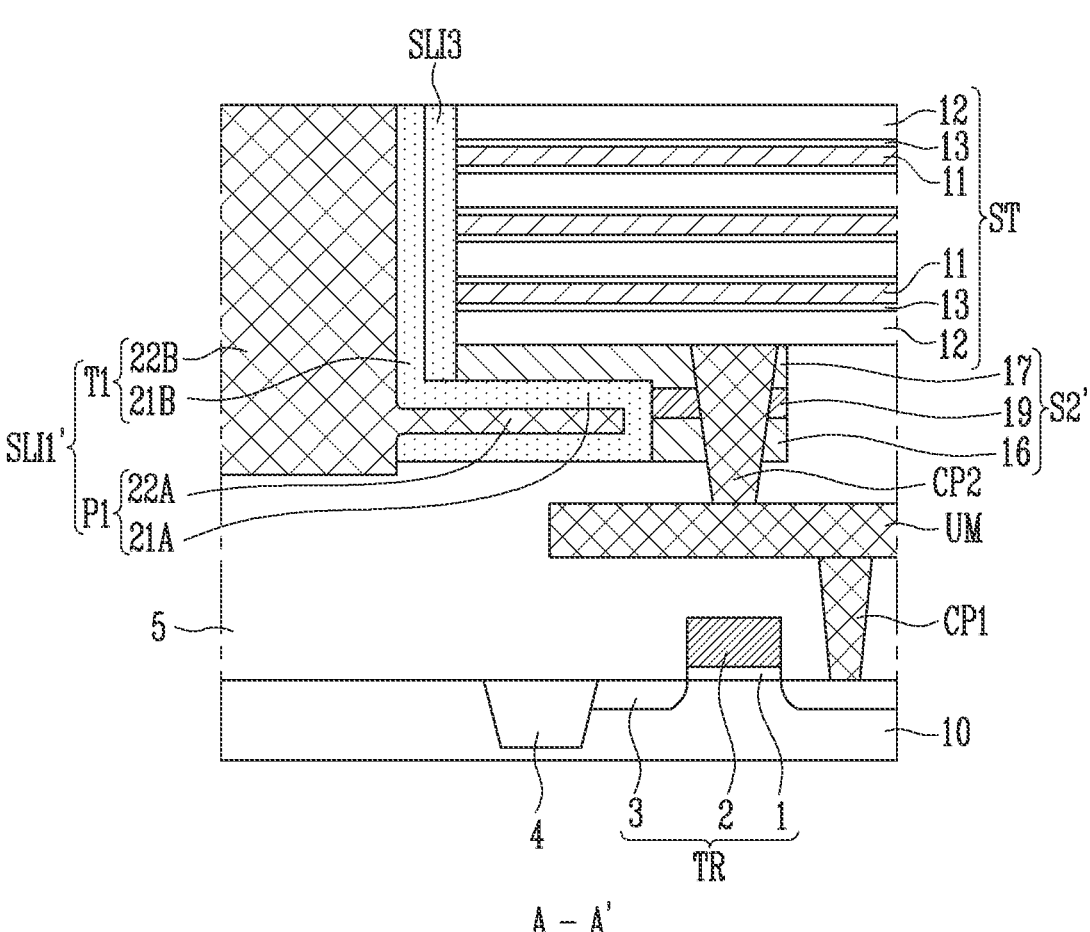

FIGS. 2A to 2C are views, illustrating a structure of a semiconductor device, in accordance with an embodiment of the present disclosure. FIG. 2A is a plane view, and FIGS. 2B and 2C are sectional views taken along the line A-A', shown in FIG. 2A. Hereinafter, the contents that overlap with those described above will be omitted.

Referring to FIGS. 2A and 2B, the semiconductor device may include a source structure S2, a stack structure ST, a first slit structure SLI1, and a second contact plug CP2. Also, the semiconductor device may further include at least one of a line UM, a second slit structure SLI2, a third slit structure SLI3, a first contact plug CP1, a channel structure CH, a substrate 10, a transistor TR, and an interlayer insulating layer 5.

The third slit structure SLI3 may penetrate the stack structure ST and intersect the first slit structure SLI1. The shape of the third slit structure SLI3 may be modified in various ways. On a plane that is defined by a first direction I and a second direction II, the third slit structure SLI3 may have an island shape, a line shape extending in the second direction II, or a C shape. Also, the third slit structure SLI3 may include at least one protrusion part that protrudes in the first direction I.

The first slit structure SLI1 and the third slit structure SLI3 may be located between second slit structures that are adjacent to each other in the second direction II.

The first slit structure SLI1 may include a portion P that overlaps with the third slit structure SLI3. On a plane, the first slit structure SLI1 may protrude into the third slit structure SLI3. On a section, the third slit structure SLI3 may protrude into the source structure S2. For example, the third slit structure SLI3 may penetrate a second source layer 17 and may be in contact with a third source layer 18. The third slit structure SLI3 may have a depth that is shallower than that of the first slit structure SLI1 or the second slit structure SLI2.

FIG. 2C is similar to FIG. 2B and illustrates a case where a first slit structure SLI1' includes a first protrusion part P1. Referring to FIGS. 2A and 2C, the first slit structure SLI1' may include a first penetration part T1 and the first protrusion part P1. An insulating spacer of the first slit structure SLI1' may include a penetration part 21B and a protrusion part 21A. A source contact structure of the first slit structure SLI1' may include a penetration part 22B and a protrusion part 22A. The second contact plug CP2 may be spaced apart from the first protrusion part P1. A sacrificial layer 19 and a first source layer 16 may be interposed between the second contact plug CP2 and the first protrusion part P1.

According to the structure described above, the first slit structure SLI1' and the third slit structure SLI3 may overlap with each other. In addition, the first protrusion part P1 may be located at the overlapping portion P or the periphery thereof. The second contact plug CP2 may be sufficiently spaced apart from the first protrusion part P1 of the first slit structure SLI1' or the first slit structure SLI1' so that the second contact plug CP2 may avoid being exposed or damaged in a manufacturing process of the semiconductor device.

Figure 3A:
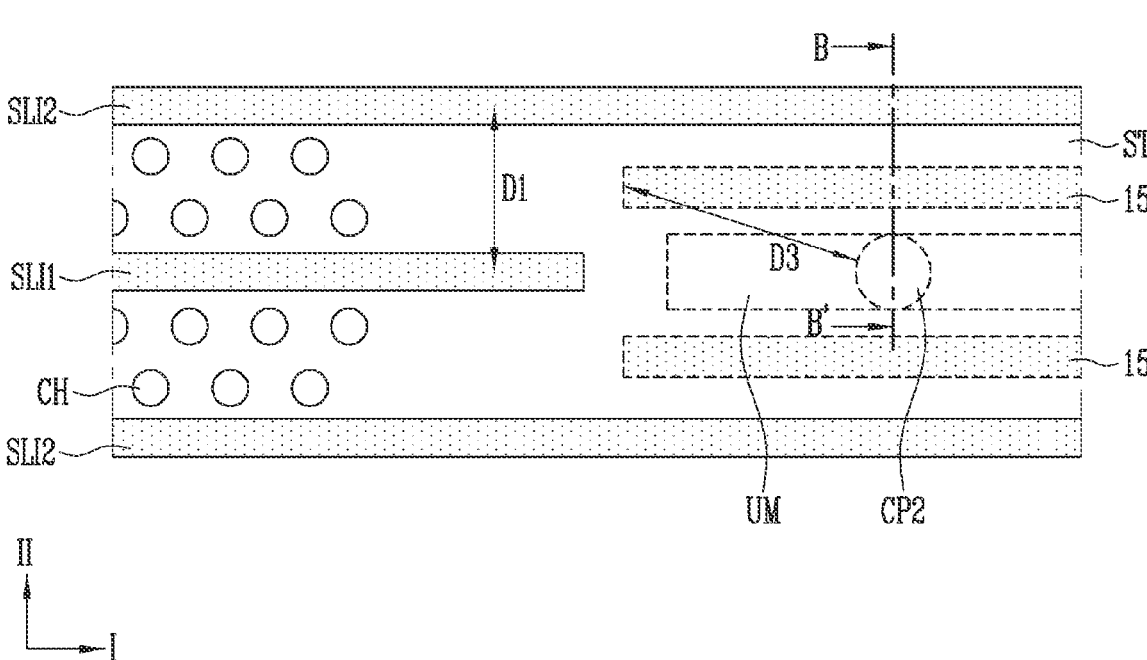
FIGS. 3A to 3C are views, illustrating a structure of a semiconductor device, in accordance with an embodiment of the present disclosure.
Figure 3B:
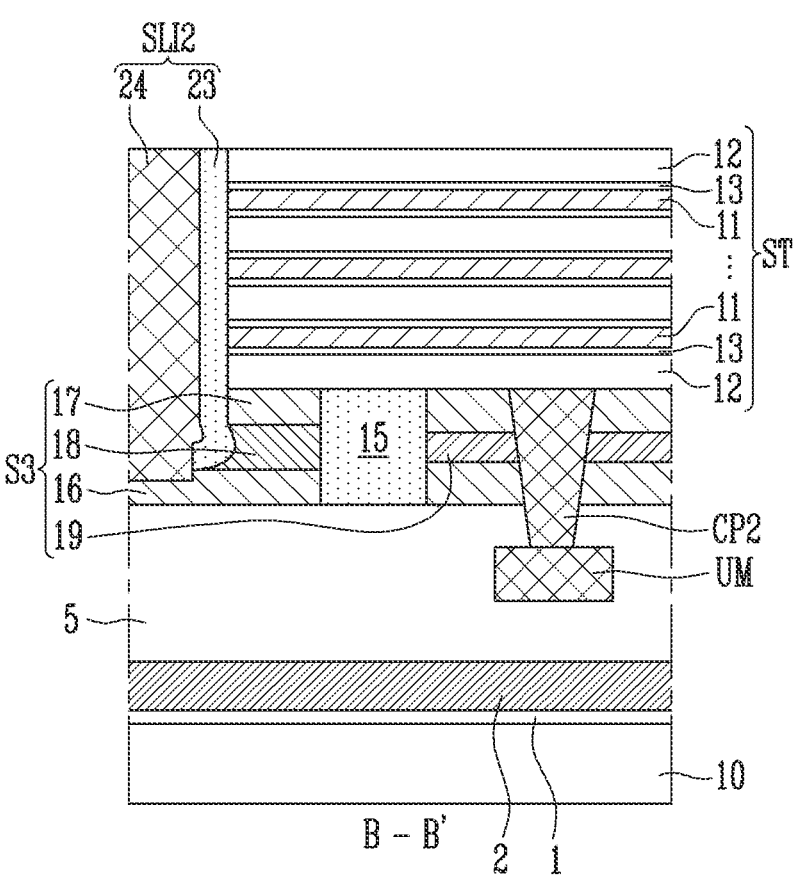
Figure 3C:
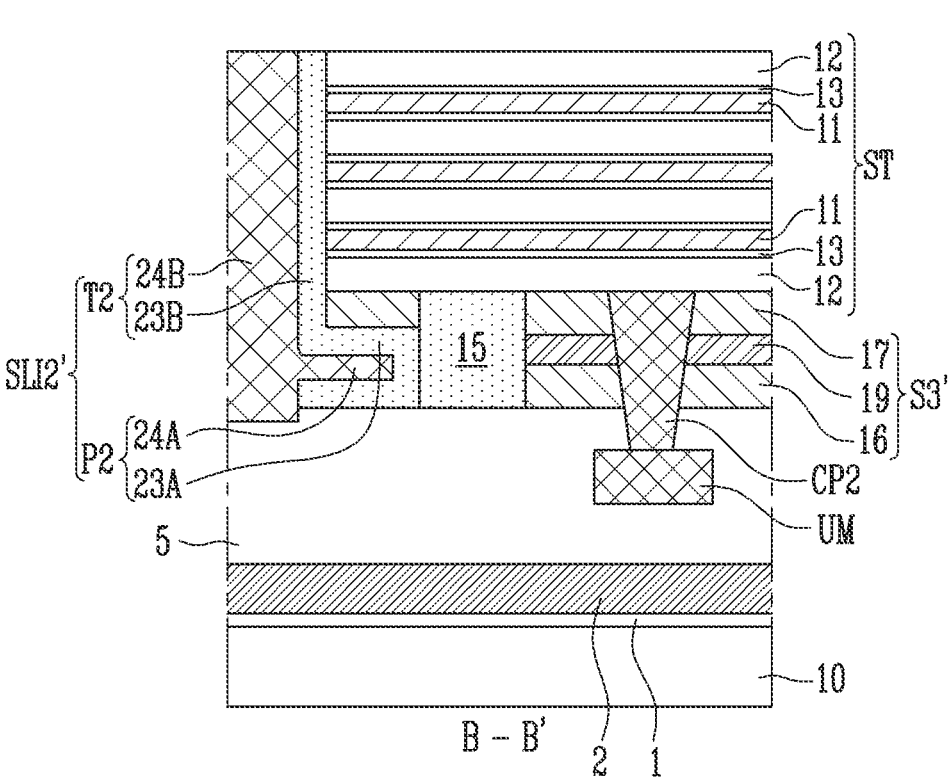

FIGS. 3A to 3C are views, illustrating a structure of a semiconductor device, in accordance with an embodiment of the present disclosure. FIG. 3A is a plane view, and FIGS. 3B and 3C are sectional views that are taken along the line B-B', shown in FIG. 3A. Hereinafter, contents that overlap with those described above will be omitted.

Referring to FIGS. 3A and 3B, the semiconductor device may include a source structure S3, a stack structure ST, a first slit structure SLI1, and a second contact plug CP2. Also, the semiconductor device may further include at least one of a line UM, a second slit structure SLI2, a first contact plug CP1, a channel structure CH, an isolation layer 15, a substrate 10, a transistor TR, and an interlayer insulating layer 5. Although not shown in the drawings, the semiconductor device may further include a third slit structure (see FIG. 2A).

The second slit structure SLI2 may include a source contact structure 24 and an insulating spacer 23, the insulating spacer 23 being formed on a sidewall of the source contact structure 24. The insulating spacer 23 may insulate the source contact structure 24 and conductive layers 11 from each other.

The isolation layer 15 may be located between the second slit structure SLI2 and the second contact plug CP2. The isolation layer 15 may extend in a first direction I. The isolation layer 15 may be located at a level that is substantially equal to that of the source structure S3. The isolation layer 15 may include an insulating material, such as an oxide or a nitride.

The second contact plug CP2 may be spaced apart from the second slit structure SLI2 in a second direction II. On a plane that is defined by the first direction I and the second direction II, the first slit structure SLI1 and the second slit structure SLI2 may be spaced apart from each other by a first distance D1 in the second direction II. On the plane, an edge of the isolation layer 15 and the second contact plug CP2 may be spaced apart from each other by a third distance D3. The third distance D3 may be a distance from the edge of the isolation layer 15 to an edge of the second contact plug CP2. The third distance D3 may be longer than the first distance D1. The third distance D3 may be twice as long as or more than twice as long as the first distance D1.

FIG. 3C is similar to FIG. 3B and illustrates a case where a second slit structure SLI2' includes a second protrusion part P2. Referring to FIGS. 3A and 3C, the second slit structure SLI2' may include a second penetration part T2 and the second protrusion part P2. The second penetration part T2 may penetrate the stack structure ST and a source structure S3'. The second protrusion part P2 may protrude inwardly, through the source structure S3', toward the second contact plug CP2 from a sidewall of the second penetration part T2. The second contact plug CP2 may be spaced apart from the second protrusion part P2. The isolation layer 15, a sacrificial layer 19, and a first source layer 16 may be interposed between the second contact plug CP2 and the second protrusion part P2.

The second slit structure SLI2' may include an insulating spacer and a source contact structure. The insulating spacer may include a penetration part 23B and a protrusion part 23A that protrude from a sidewall of the penetration part 23B. The source contact structure may include a penetration part 24B and a protrusion part 24A that protrude from a sidewall of the penetration part 24B.

According to the structure described above, the second slit structure SLI2 and the second contact plug CP2 may be spaced apart from each other by the isolation layer 15, or the second protrusion part P2 of the second slit structure SLI2' and the second contact plug CP2 may be spaced apart from each other by the isolation layer 15. Thus, the second contact plug CP2 may avoid being exposed or damaged in a manufacturing process of the semiconductor device.

FIGS. 4A to 10A, 4B to 10B, and 6C to 10C are views, illustrating a manufacturing method of a semiconductor device, in accordance with an embodiment of the present disclosure. Each of FIGS. 4A to 10A is a plan view, each of FIGS. 4B to 10B is a sectional view that is taken along the line A-A', shown in each of FIGS. 4A to 10A, and each of FIGS. 6C to 10C is a sectional view that is taken along the line C-C', shown in each of FIGS. 6A to 10A.

Figure 4A:
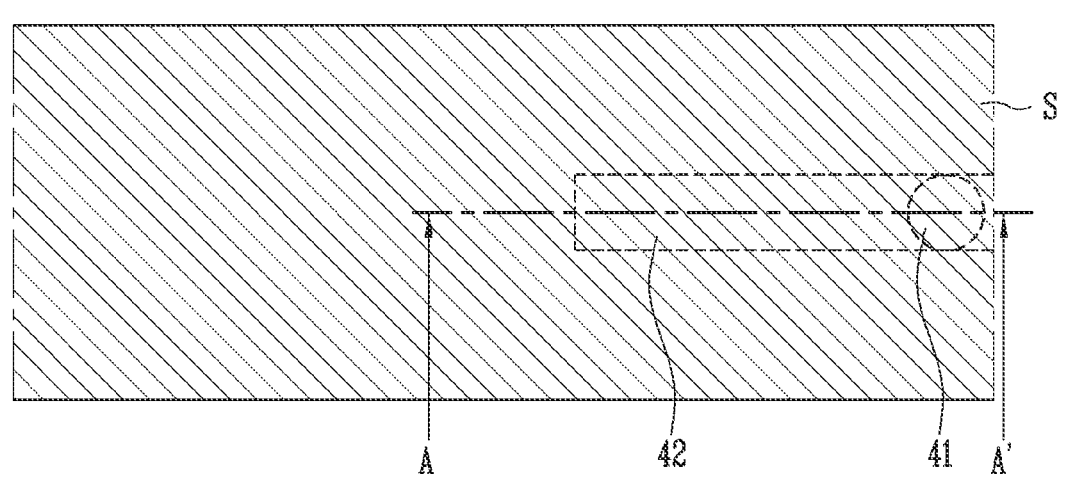
Figure 4B:
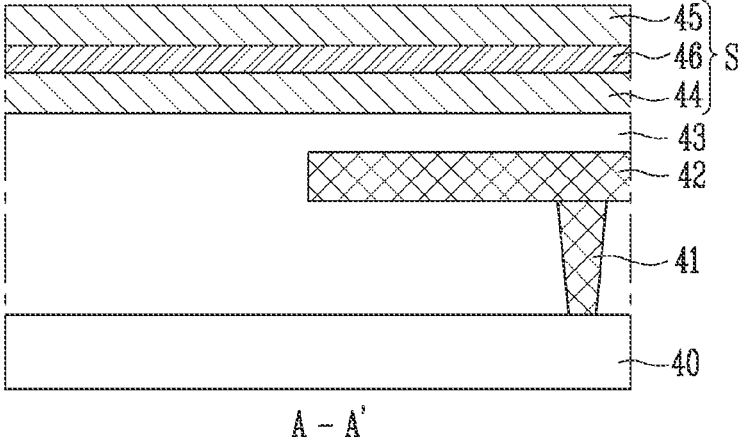

Referring to FIGS. 4A and 4B, an interconnection structure and an interlayer insulating layer 43 may be formed on a base 40. The base 40 may include a substrate, a peripheral circuit, and the like. The interconnection structure may include a first contact plug 41, a line 42, and the like. The interconnection structure may be formed in the interlayer insulating layer 43 and may be electrically connected to the base 40. For example, the first contact plug 41 may be electrically connected to the peripheral circuit, the substrate, and the like. The interlayer insulating layer 43 may be a single layer or a multi-layer.

Subsequently, a source structure S may be formed on the interlayer insulating layer 43. The source structure may include a single layer or a multi-layer. The source structure S may include a sacrificial layer 46. The source structure S may further include a first source layer 44 and a second source layer 45. The sacrificial layer 46 may be interposed between the first source layer 44 and the second source layer 45. The sacrificial layer 46 may be a single layer or a multi-layer.

The first source layer 44 and the second source layer 45 may include a conductive layer, such as poly-silicon or tungsten. The sacrificial layer 46 may include poly-silicon, oxide, nitride, etc.

Figure 5A:
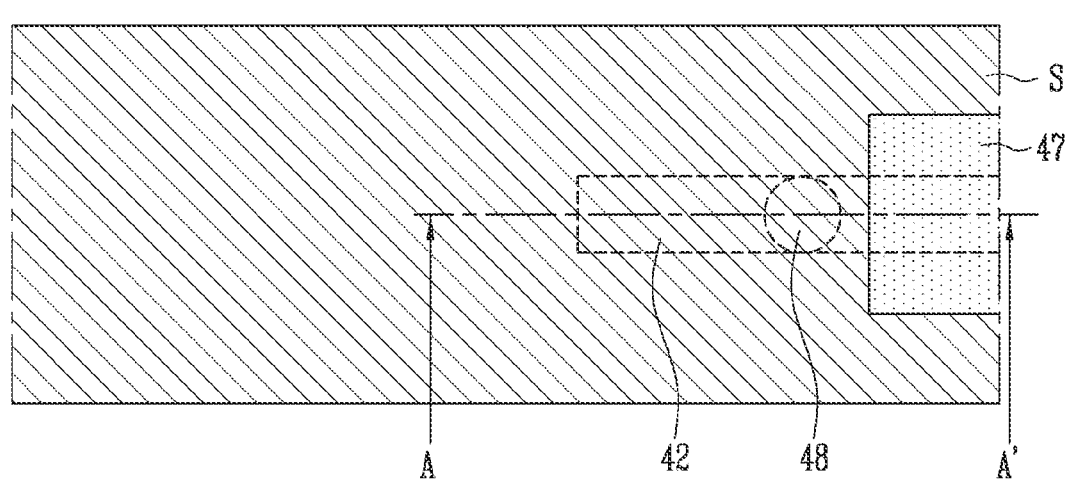
Figure 5B:
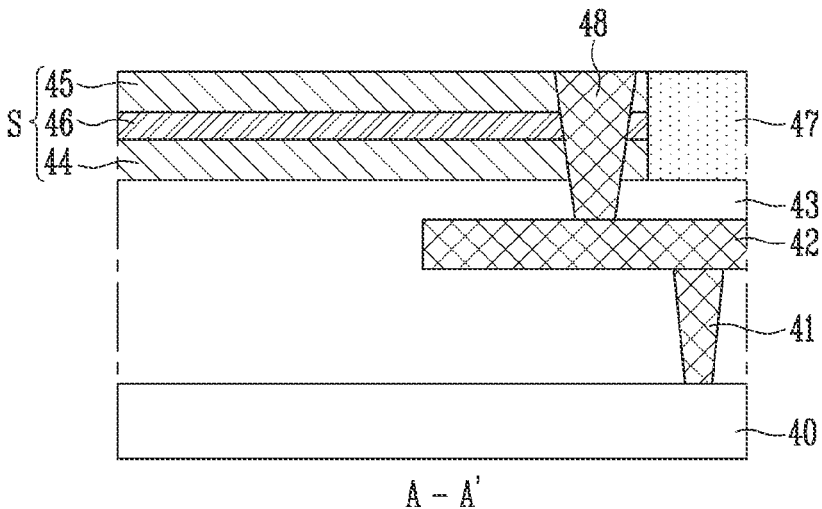

Referring to FIGS. 5A and 5B, the source structure S may be patterned. After a trench may be formed by etching the source structure S, an isolation layer 47 may be formed in the trench. The number, positions, shape, etc. of isolation layers 47 may be varied. The isolation layer 47 may be a layer that isolates the source structure S in a unit of a memory block or may be a barrier that restricts the position of a cavity. The memory block may be a unit in which an erase operation is performed. The memory block may include a plurality of memory strings.

Subsequently, a second contact plug 48 may be formed. For example, after a contact hole, penetrating the source structure S and exposing the line 42, may be formed, the second contact plug 48 may be formed by filling the contact hole with a conductive layer. The second contact plug 48 may penetrate the source structure S and may be connected to the line 42. The source structure S may be electrically connected to the base 40 through the second contact plug 48, the line 42, and the first contact plug 41.

The positions of the line 42 and the second contact plug 48 may be determined by considering the position of a first slit SL1 or a second slit SL2, both of which are formed in a subsequent process. The line 42 and the second contact plug 48 may be sufficiently spaced apart from the first slit SL1 or the second slit SL2.

Figure 6A:
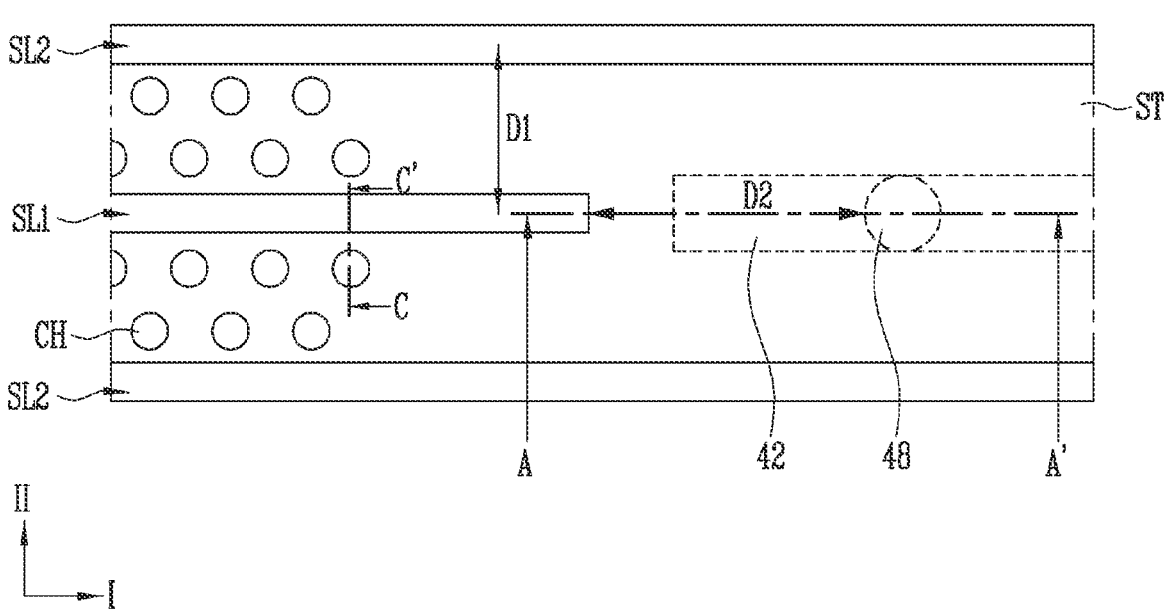
Figure 6B:
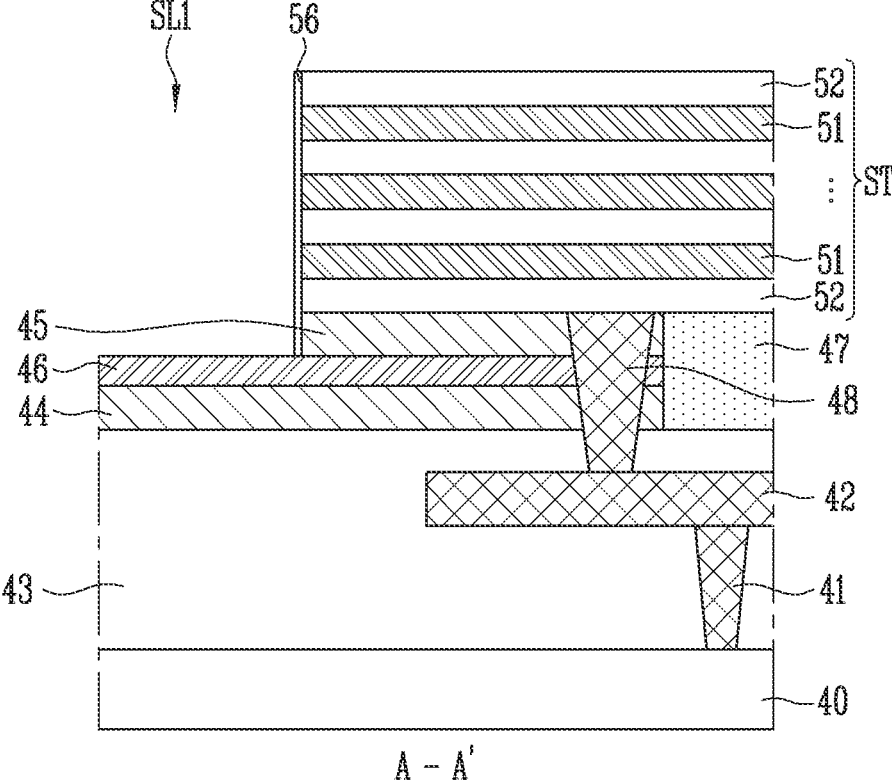
Figure 6C:
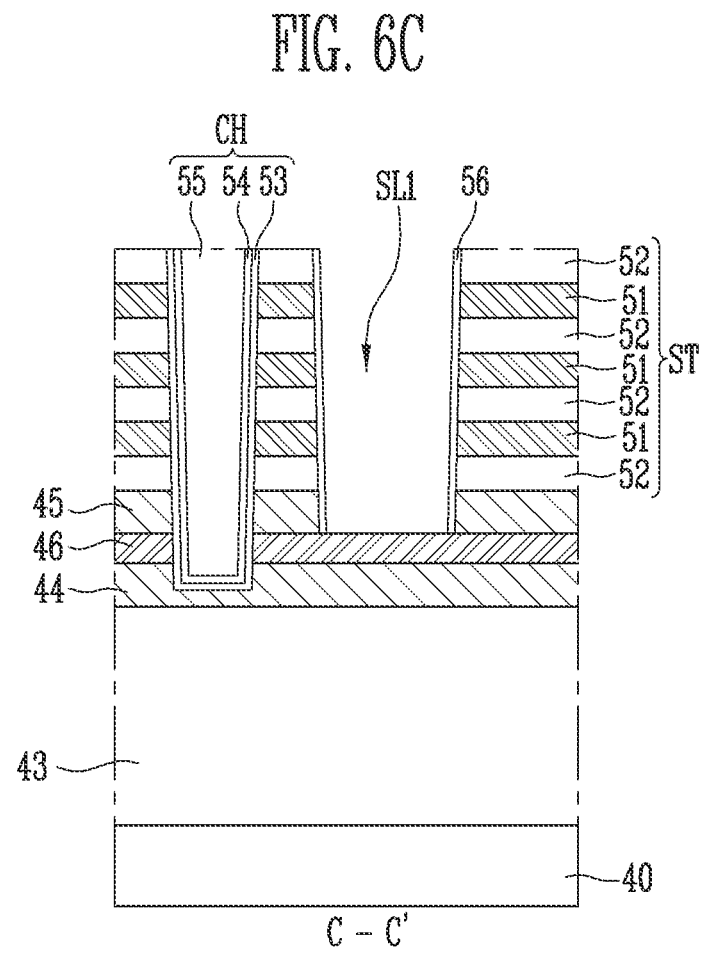

Referring to FIGS. 6A to 6C, a stack structure ST may be formed. The stack structure ST may include first material layers 51 and second material layers 52, which are stacked in an alternating manner. The first material layers 51 may be layers to form gate electrodes of a memory cell, a select transistor, and the like, and the second material layers 52 may be layers to insulate the stacked gate electrodes from each other.

The first material layers 51 may include a material with a high etch selectivity compared to the second material layers 52. For example, the first material layers 51 may be sacrificial layers, including nitride, etc., and the second material layers 52 may be insulating layers, including oxide, etc. In another example, the first material layers 51 may be conductive layers, including poly-silicon, tungsten, etc., and the second material layers 52 may be insulating layers, including oxide, etc.

Subsequently, channel structures CH may be formed. The channel structures CH may penetrate the stack structure ST. The channel structures CH may protrude through a portion of the source structure S. Each of the channel structures CH may include a channel layer 54 and may further include a first memory layer 53 and a gap fill layer 55. The first memory layer 53 may include at least one of a blocking layer, a data storage layer, and a tunnel insulating layer.

Subsequently, the first slit SL1, which penetrates the stack structure ST, may be formed. The first slit SL1 may penetrate the stack structure ST and may extend in a first direction I. The first slit SL1 and the second contact plug 48 may be adjacent to each other in the first direction I. The first slit SL1 may be formed to expose a surface of the source structure S or may be formed to partially penetrate the source structure S. The first slit SL1 may be formed to expose the sacrificial layer 46.

The second slit SL2, which penetrates the stack structure ST, may be formed. The second slit SL2 may penetrate the stack structure ST and may be extend in the first direction I. The second slit SL2 and the second contact plug 48 may be adjacent to each other in a second direction II. The second slit SL2 may be formed when the first slit SL1 is formed. The second slit SL2 may have a depth that is substantially equal to that of the first slit SL1. The channel structures CH may be located between the first slit SL1 and the second slit SL2, which are adjacent to each other.

On a plane that is defined by the first direction I and the second direction II, the first slit SL1 and the second slit SL2 may be spaced apart from each other by a first distance D1 in the second direction II. On the plane, the first slit SL1 and the second contact plug 48 may be spaced apart from each other by a second distance D2 in the first direction I. The second distance D2 may be a distance from an edge of the first slit SL1 to an edge of the second contact plug 48. The second distance D2 may be longer than the first distance D1. The second distance D2 may be twice as long as or more than twice as long as of the first distance D1.

A third slit structure (see the third slit structure shown in FIG. 2A) may be formed before the first slit SL1 and the second slit SL2 are formed. The first slit SL1 may be formed to intersect the third slit structure.

Subsequently, a protective layer 56 may be formed on an inner wall of the first slit SL1. The protective layer 56 may include a material with a high etch selectivity compared to the sacrificial layer 46. The sacrificial layer 46 may include poly-silicon, and the protective layer 56 may include a nitride, an oxide, etc. The sacrificial layer 46 may include a nitride, an oxide, etc., and the protective layer 56 may include poly-silicon. The protective layer 56 may also be formed on an inner wall of the second slit SL2.

Figure 7A:
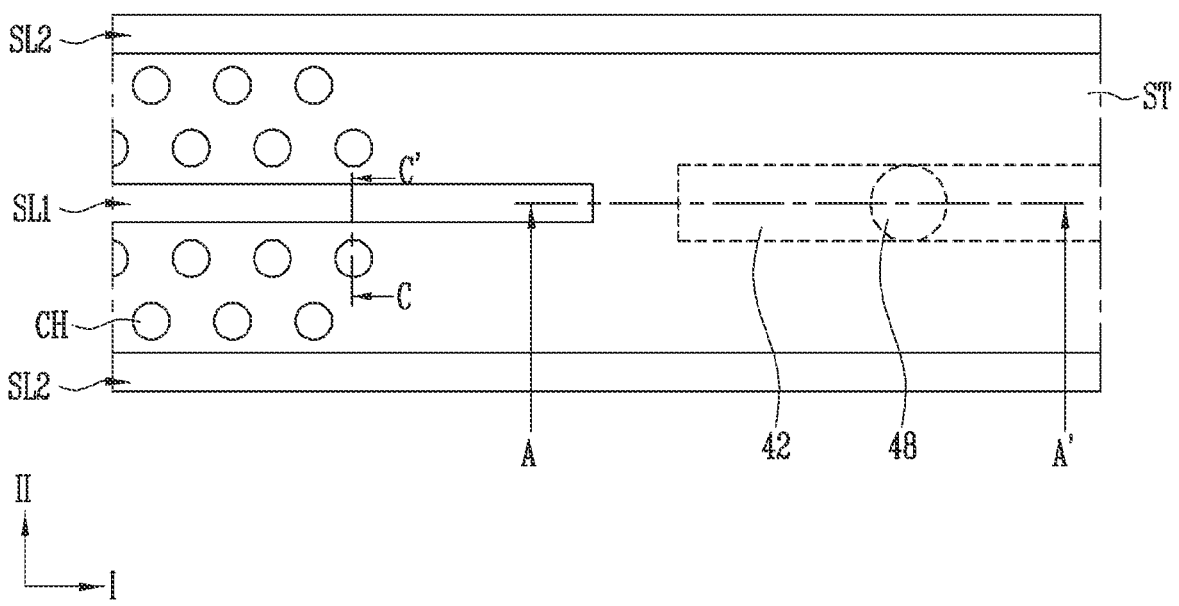
Figure 7B:
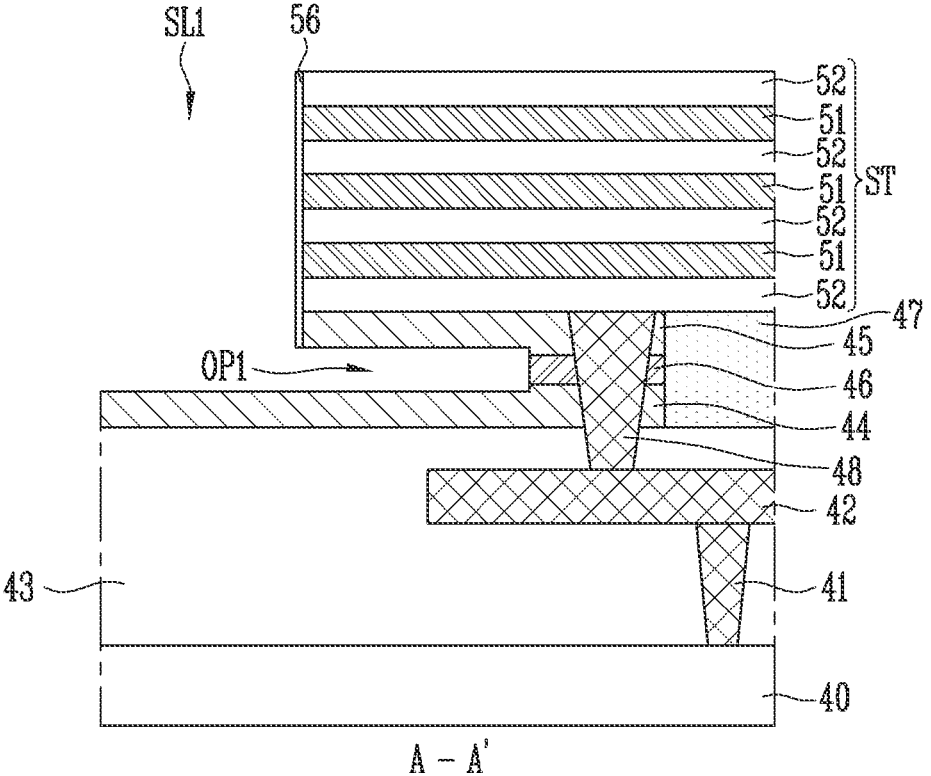
Figure 7C:
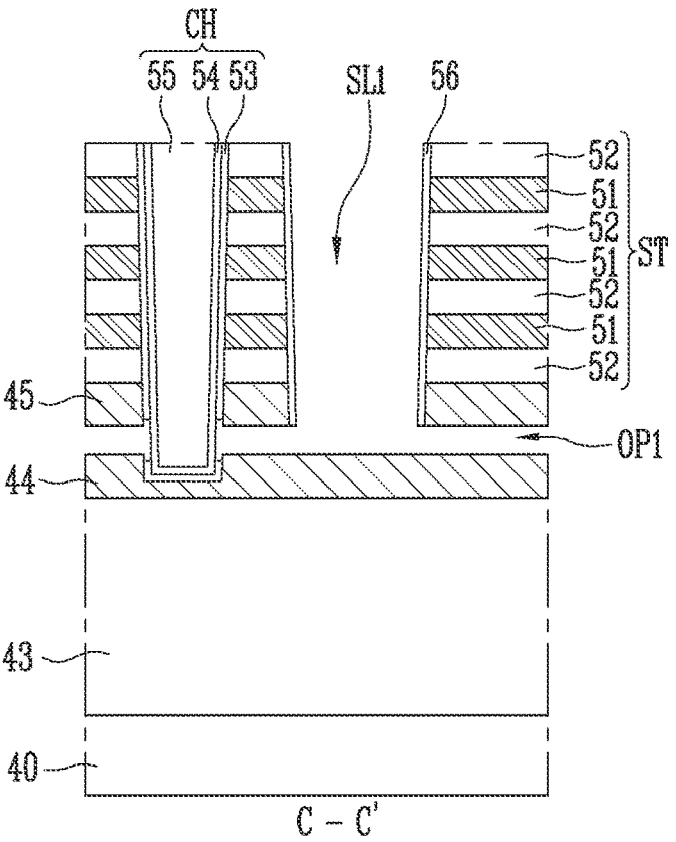

Referring to FIGS. 7A to 7C, a first opening OP1 may be formed by removing the sacrificial layer 46 through the first slit SL1 or the second slit SL2. The first opening OP1 may be formed by selectively etching the sacrificial layer 46. When the sacrificial layer 46 is etched, the first material layers 51 and the second material layers 52 may be protected by the protective layer 56.

The sacrificial layer 46 may be etched by an etching composition that is introduced through the first slit SL1. The sacrificial layer 46, in a region that is adjacent to the first slit SL1, may be etched. Furthermore, the sacrificial layer 46, in a region that is spaced apart from the first slit SL1, may remain. Since the channel structure CH is adjacent to the first slit SL1, the first memory layer 53 may be exposed through the first opening OP1. On the other hand, since the second contact plug 48 is spaced apart from the first slit SL1, the sacrificial layer 46, at the periphery of the second contact plug 48, may remain. Therefore, the second contact plug 48 might not be exposed through the first opening OP1. The etching composition may be introduced through the second slit SL2, and the first opening OP1 may be formed by removing the sacrificial layer 46 through the second slit SL2.

Subsequently, the first memory layer 53, exposed through the first opening OP1, may be etched. Accordingly, the channel layer 54 may be exposed. When the first memory layer 53 is etched, the first material layers 51 and the second material layers 52 may be protected by the protective layer 56.

Figure 8A:
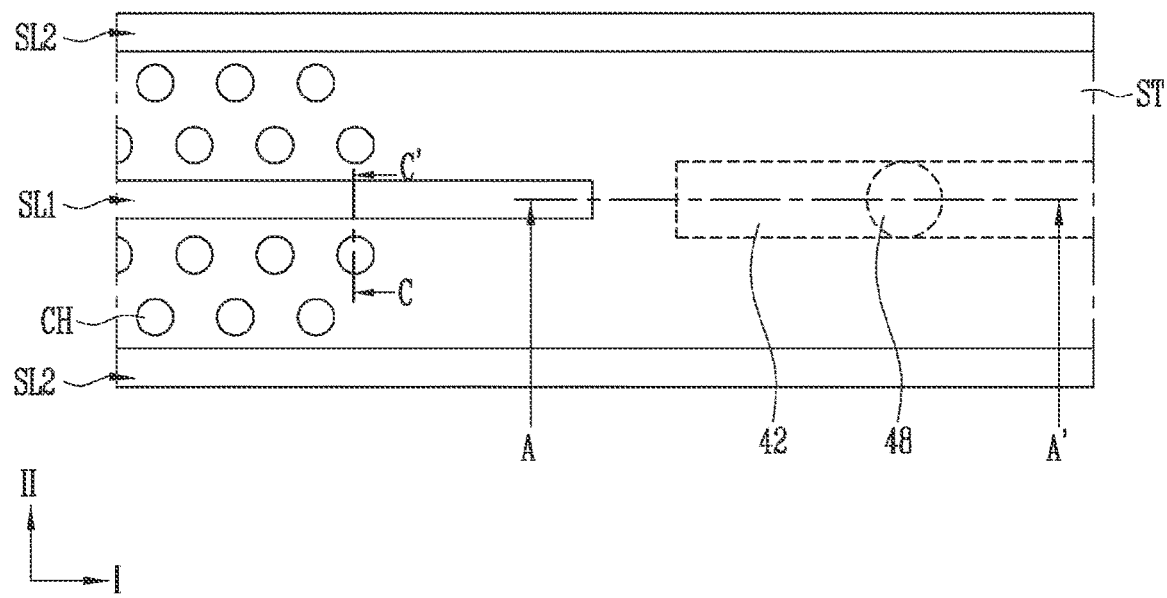
Figure 8B:
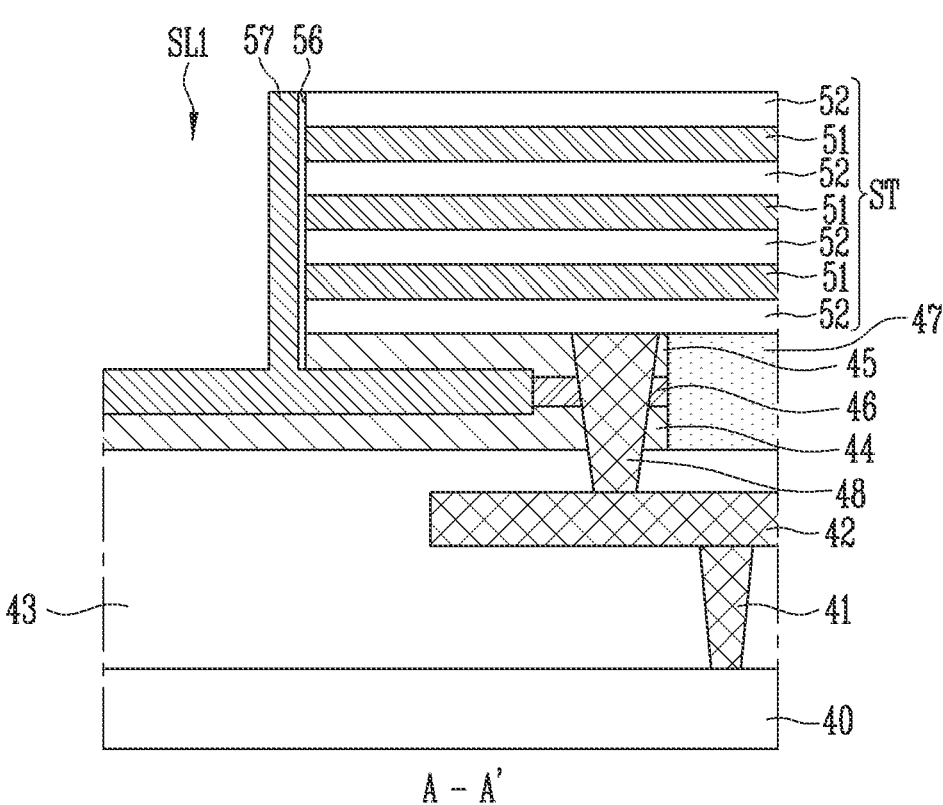
Figure 8C:
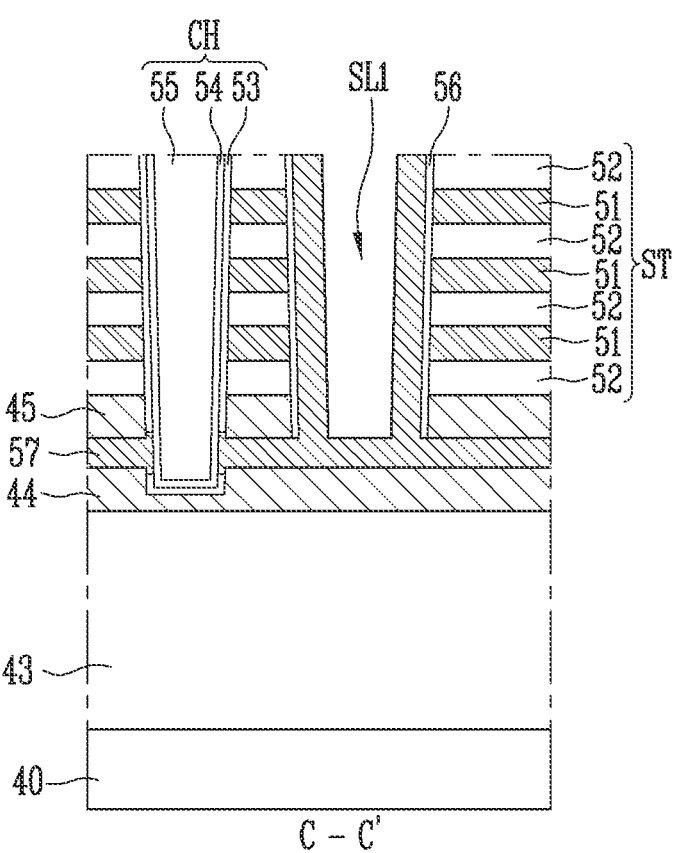

Referring to FIGS. 8A to 8C, a conductive layer 57 may be formed to fill the first opening OP1. The conductive layer 57 may be formed even in the first slit SL1 or the second slit SL2. The conductive layer 57 may include a conductive material, such as poly-silicon or metal.

Figures 9A, 9B:
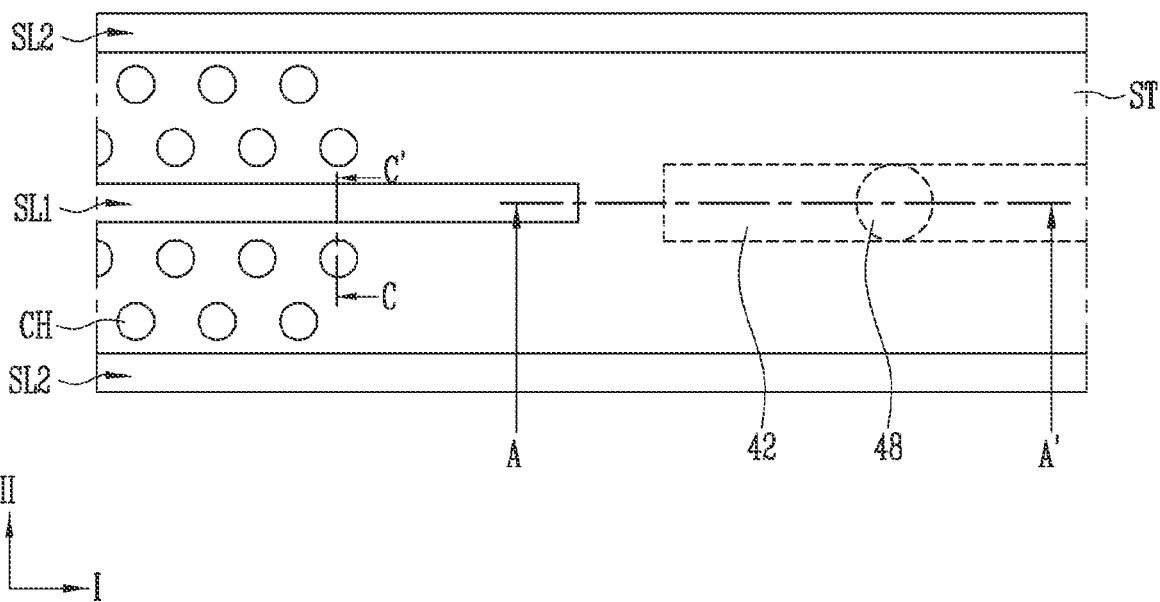
Figure 9C:
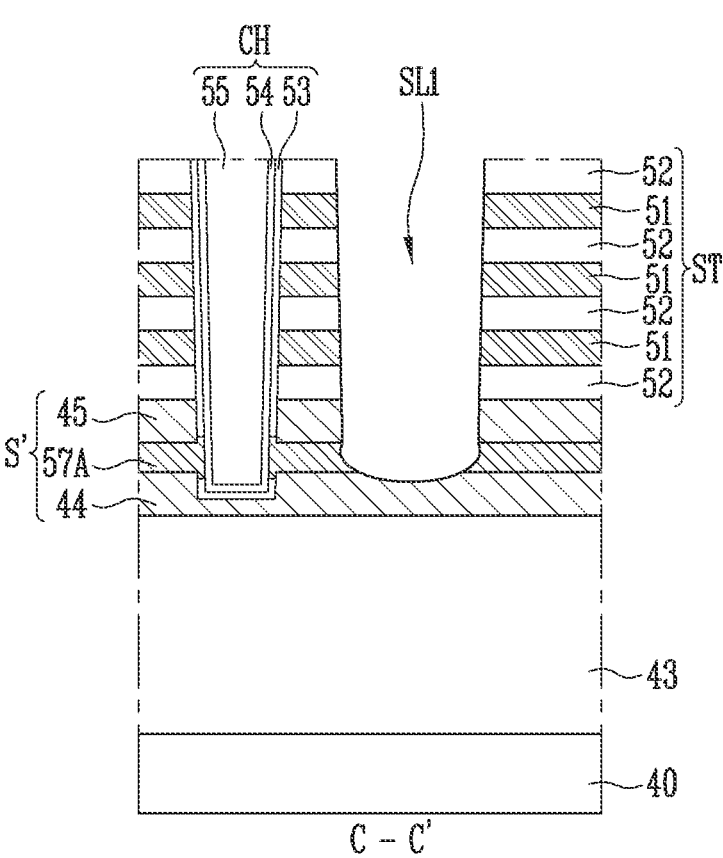

Referring to FIGS. 9A to 9C, a third source layer 57A may be formed. The third source layer 57A may be formed by etching the conductive layer 57 that is formed in the first slit SL1 or the second slit SL2. The third source layer 57A may be located in the first opening OP1. The third source layer 57A may penetrate the first memory layer 53 and may be directly connected to the channel layer 54. Accordingly, a source structure S', which includes the first source layer 44, the second source layer 45, and the third source layer 57A, may be formed. The source structure S' may further include the sacrificial layer 46, remaining in a partial region. Subsequently, the protective layer 56 may be removed.

Figure 10A:
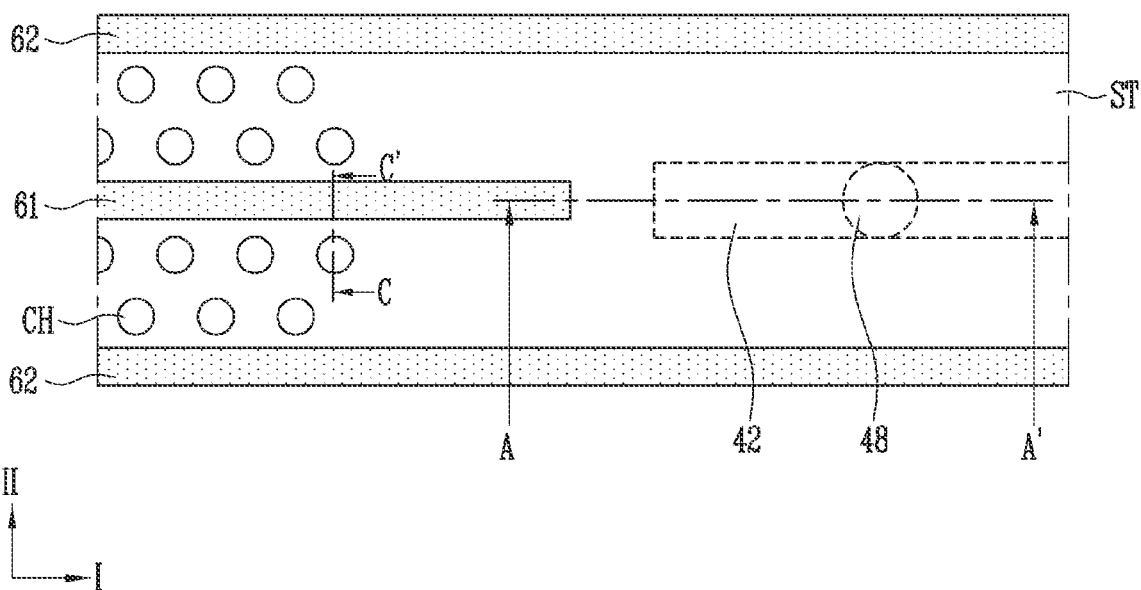
Figure 10B:
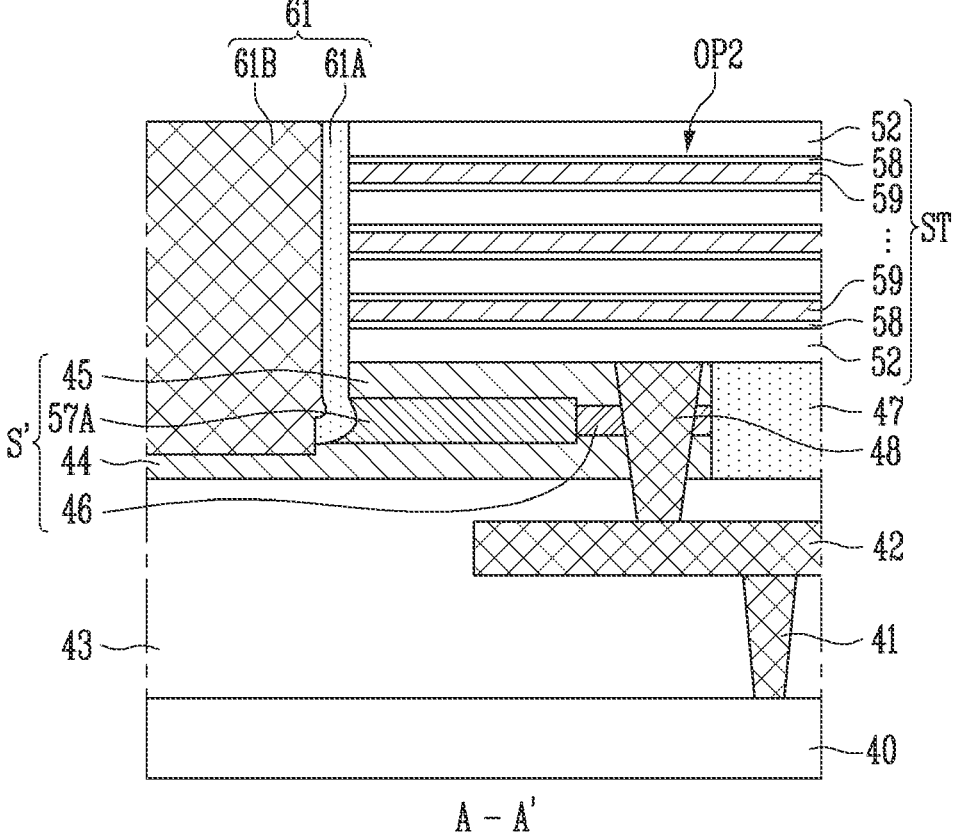
Figure 10C:
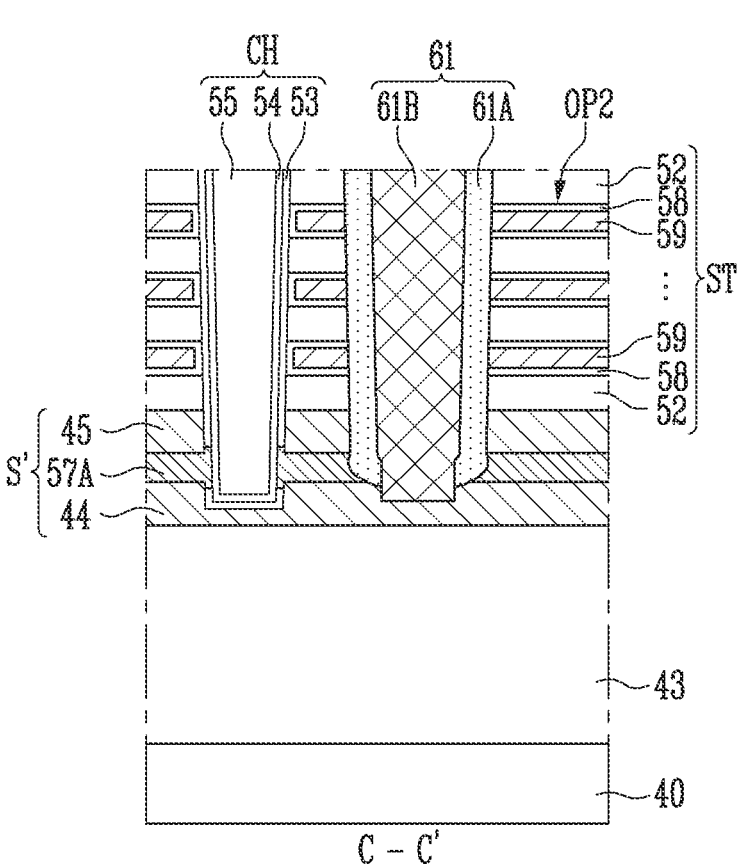

Referring to FIGS. 10A to 10C, the first material layers 51 may be replaced with conductive layers 59. For example, second openings OP2 may be formed by selectively etching the first material layers 51. Subsequently, the conductive layers 59 may be respectively formed in the second openings OP2.

Before the conductive layers 59 are formed, second memory layers 58 may be additionally formed. Each of the second memory layers 58 may include at least one of a tunnel insulating layer, a data storage layer, and a blocking layer. For example, the conductive layers 59 may be formed after the blocking layer is formed in the second openings OP2. Then, a heat treatment process may be performed on the blocking layer. The blocking layer may include aluminum oxide ($Al_2O_3$).

Subsequently, a first slit structure 61 may be formed in the first slit SL1. The first slit structure 61 may be formed by filling the first slit SL1 with an insulating material. Alternatively, after an insulating spacer 61A is formed on a sidewall of the first slit SL1, a source contact structure 61B that is electrically connected to the source structure S' may be formed by filling the first slit SL1 with a conductive material so that the first slit structure 61 can be formed.

In addition, a second slit structure 62 may be formed in the second slit SL2. The second slit structure 62 may be formed when the first slit structure 61 is formed.

According to the manufacturing method described above, the first slit SL1 and the second contact plug 48 may be sufficiently spaced apart from each other. Thus, the second contact plug 48 might not be exposed in the process of replacing the sacrificial layer 46 with the third source layer 57A and replacing the first material layers 51 with the conductive layers 59. Accordingly, the second contact plug 48 may avoid being damaged in a manufacturing process of the semiconductor device.

FIGS. 11A to 11E are views, illustrating a manufacturing method of a semiconductor device, in accordance with an embodiment of the present disclosure. FIGS. 11A to 11E may respectively correspond to FIGS. 6B to 10B. Hereinafter, contents that overlap with those described above will be omitted.

Figure 11A:
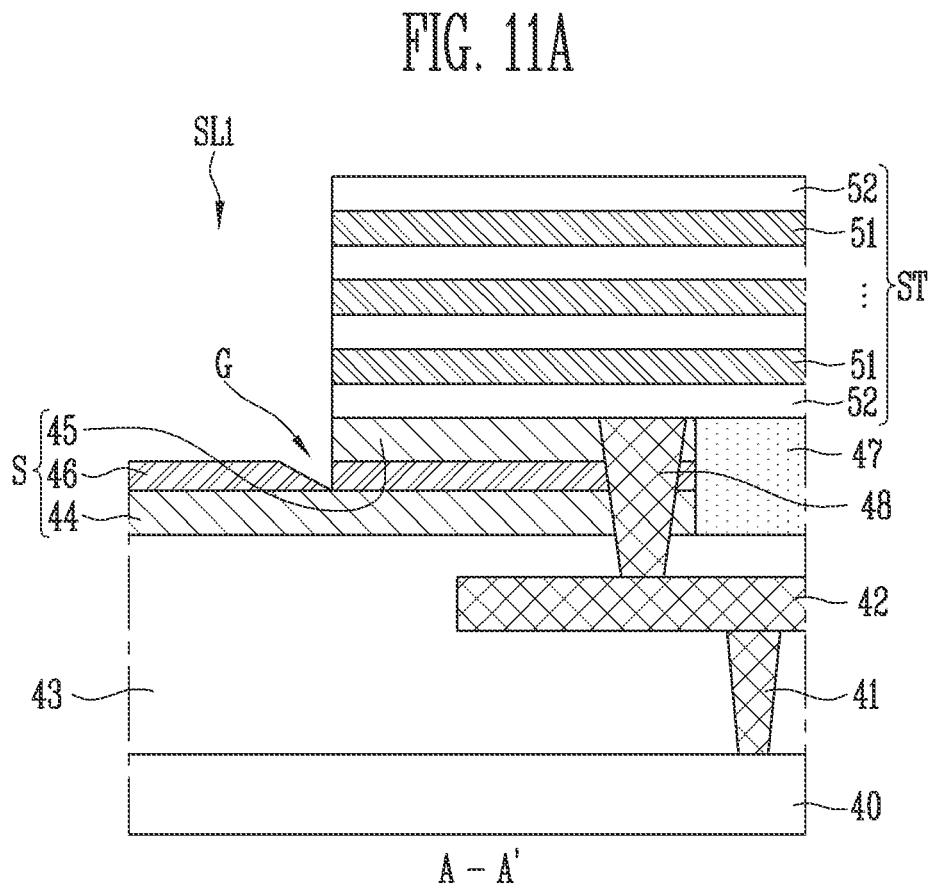

Referring to FIG. 11A, the first slit SL1, which penetrates the stack structure ST, may be formed. The first slit SL1 may expose the source structure S. The first slit SL1 may be formed by performing an etching process to a target depth in which the first slit SL1 exposes the sacrificial layer 46.

When the first slit SL1 is formed, a partial region may be formed to have a depth that is deeper than that of the other region. The sacrificial layer 46 may be etched in the partial region such that a groove G may be formed, and the first source layer 44 may be exposed through the groove G. For example, the groove G may be formed at a portion at which the first slit SL1 overlaps with a third slit structure (see FIG. 2A). Subsequently, the protective layer 56 may be formed on an inner wall of the first slit SL1.

Figure 11B:
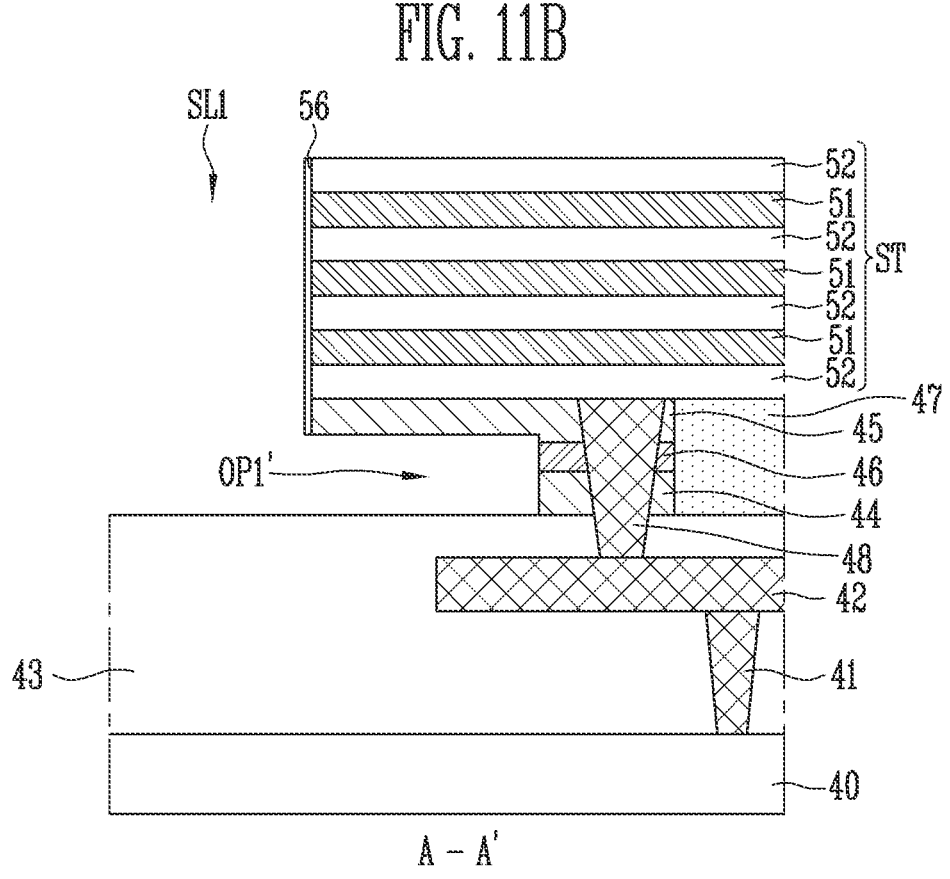

Referring to FIG. 11B, a first opening OP1' may be formed by selectively etching the sacrificial layer 46 through the first slit SL1. However, when the sacrificial layer 46 is etched, the first source layer 44 that is exposed through the groove G may be etched together with the sacrificial layer 46. Therefore, the sacrificial layer 46 and the first source layer 44 may be etched at the periphery of the groove G, and the first opening OP1' may be formed to have a thickness that is thicker than that of another region. The interlayer insulating layer 43 may be exposed through the first opening OP1'. However, since the second contact plug 48 is sufficiently spaced apart from the first slit SL1, the second contact plug 48 might not be exposed through the first opening OP1'.

Subsequently, as described with reference to FIG. 7C, the first memory layer 53 that is exposed through the first opening OP1 is etched. Accordingly, the channel layer 54 may be exposed.

Figure 11C:
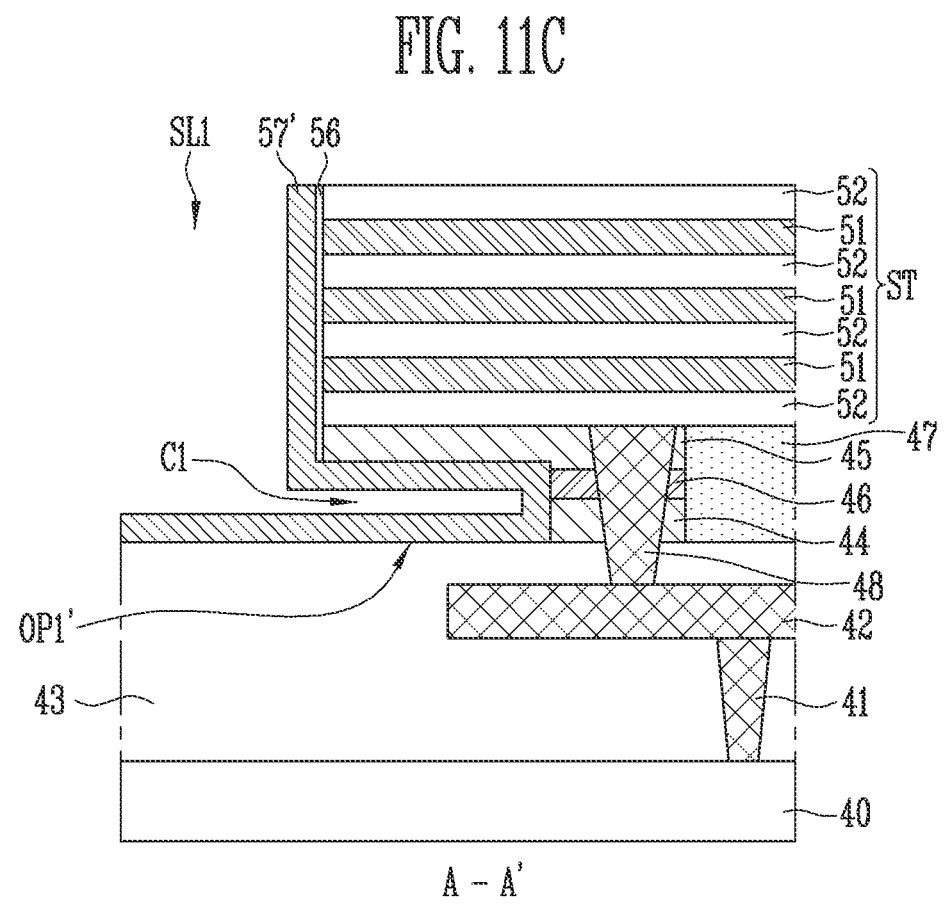

Referring to FIG. 11C, a conductive layer 57' may be formed. The conductive layer 57' may be formed in the first opening OP1' and the first slit SL1. The conductive layer 57' may be formed along the inner surfaces of the first opening OP1' and the first slit SL1. The conductive layer 57' may be formed to a thickness without completely filling the first opening OP1' and the first slit SL1. The conductive layer 57' may include a first cavity C1 that is located in the first opening OP1'. The conductive layer 57' may include a conductive material, such as poly-silicon or metal.

Figure 11D:
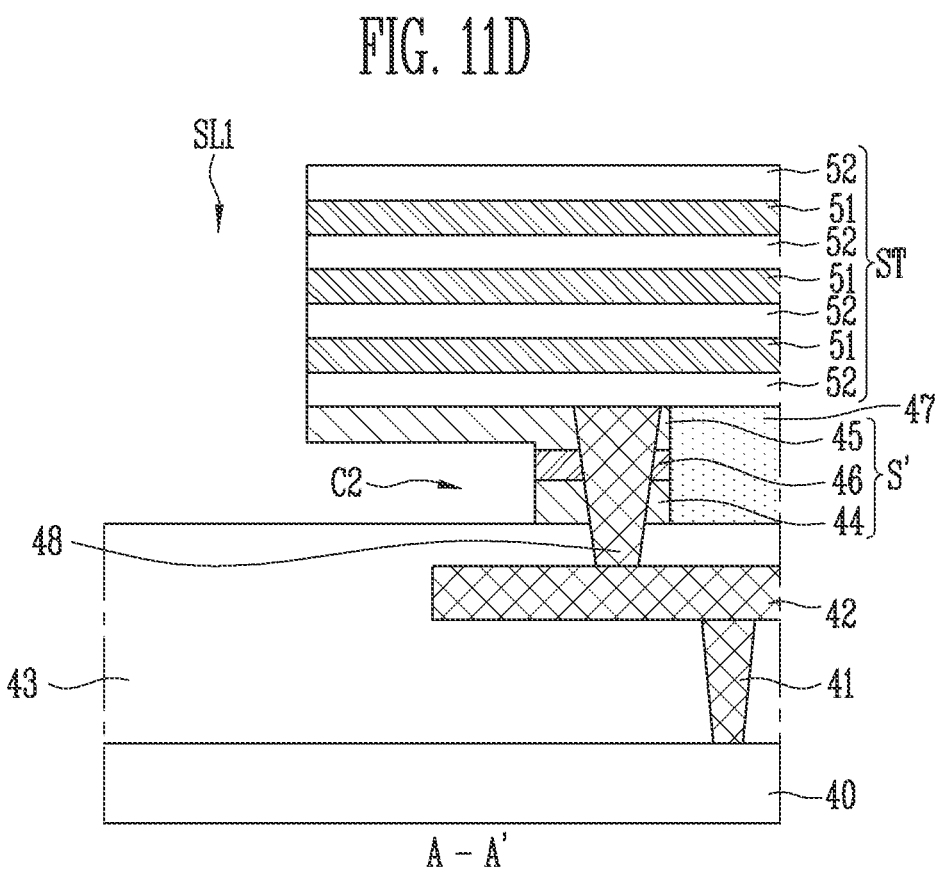

Referring to FIG. 11D, the conductive layer 57', formed in the first slit SL1, may be etched. Accordingly, the third source layer 57A (see FIG. 9C) may be formed in the first opening OP1', and a source structure S' may be formed, the source structure S' including the first source layer 44, the second source layer 45, the third source layer 57A, and the sacrificial layer 46.

However, an etching composition may be introduced into the first cavity C1 during the process of etching the conductive layer 57'. The etching speed may increase at the periphery of the first cavity C1. Therefore, the conductive layer 57', at the periphery of the first cavity C1, may be etched, and a second cavity C2 may be formed in the source structure S'. The second cavity C2 may extend from the first cavity C1. Since the second contact plug 48 is spaced apart from the second cavity C2, the second contact plug 48 might not be exposed through the second cavity C2. Subsequently, the protective layer 56 may be removed.

Figure 11E:
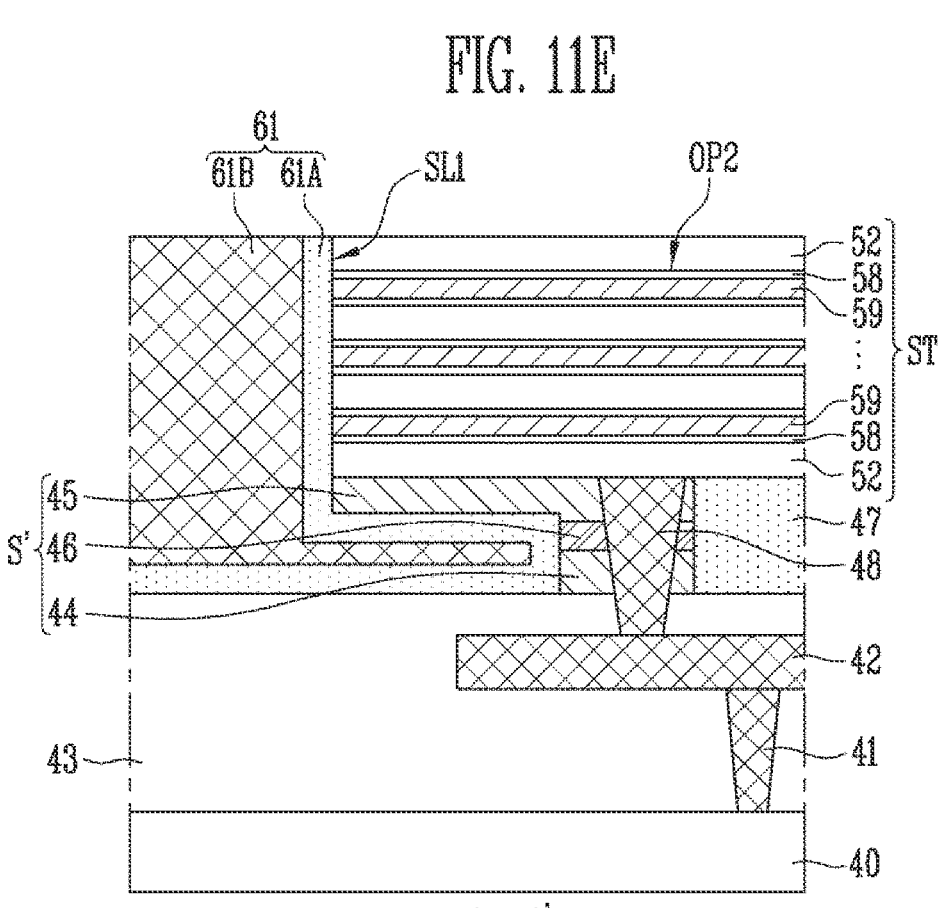

Referring to FIG. 11E, the first material layers 51 may be replaced with conductive layers 59. Before the conductive layers 59 are formed, the second memory layers 58 may be additionally formed. Each of the second memory layers may include at least one of a tunnel insulating layer, a data storage layer, and a blocking layer. The blocking layer may include aluminum oxide ($Al_2O_3$).

In an embodiment, the second openings OP2 may be formed where the first material layers 51 were initially formed, and the blocking layer may be formed in the second openings OP2. Subsequently, after a heat treatment process is performed, the conductive layers 59 may be formed in the second openings OP2. When the second contact plug 48 is located close to the first slit SL, the second contact plug 48 may be exposed through the second cavity C2. In addition, the exposed second contact plug 48 may be oxidized or damaged through the heat treatment process. On the other hand, in accordance with an embodiment of the present disclosure, since the second contact plug 48 is sufficiently spaced apart from the first slit SL1, the second contact plug 48 is not exposed through the second cavity C2. Thus, although the heat treatment process is performed, the second contact plug 48 is not oxidized or damaged.

Subsequently, after the insulating spacer 61A may be formed in the first slit SL1, the source contact structure 61B may be formed. The insulating spacer 61A and the source contact structure 61B may be formed even in the second cavity C2.

According to the manufacturing method described above, the groove G may be formed in the process of forming the first slit SL1, and therefore, the conductive layer 57' may be formed in a shape including the first cavity C1. In addition, the first cavity C1 extends to the second cavity C2 in the process of etching the conductive layer 57'. However, since the second contact plug 48 is sufficiently spaced apart from the first slit SL1, the second contact plug 48 is not exposed through the second cavity C2. Thus, the second contact plug 48 may avoid being damaged in a manufacturing process of the semiconductor device.

Figure 12A:
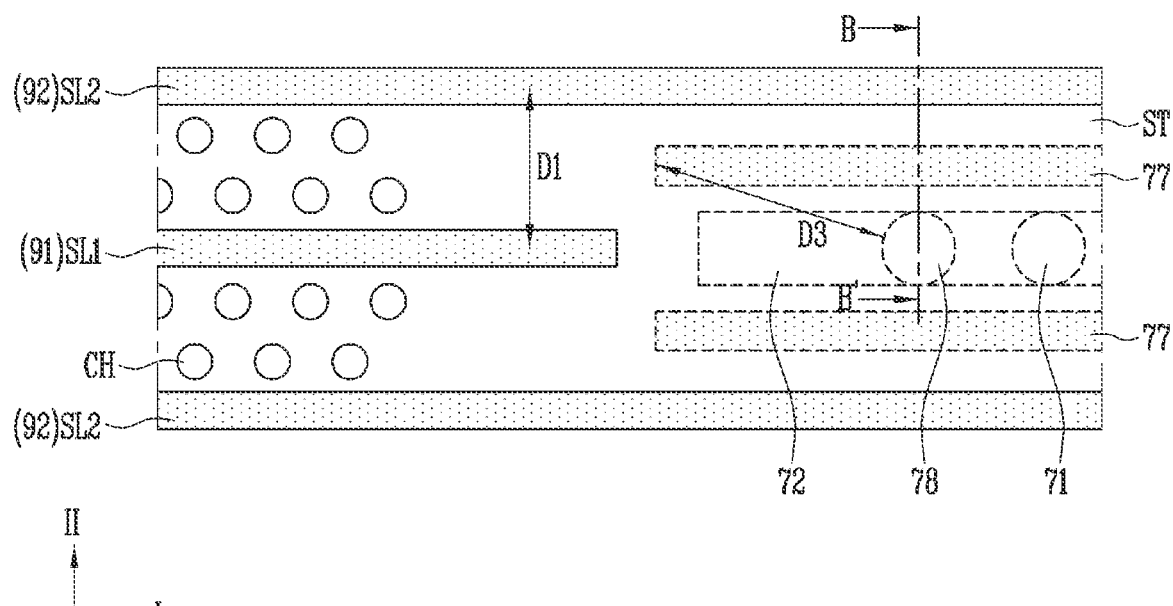

FIGS. 12A to 12F are views illustrating a manufacturing method of a semiconductor device in accordance with an embodiment of the present disclosure. FIG. 12A is a plan view, and FIGS. 12B to 12F are sectional views taken along line B-B' shown in FIG. 12A. Hereinafter, contents overlapping with those described above will be omitted.

Figure 12B:
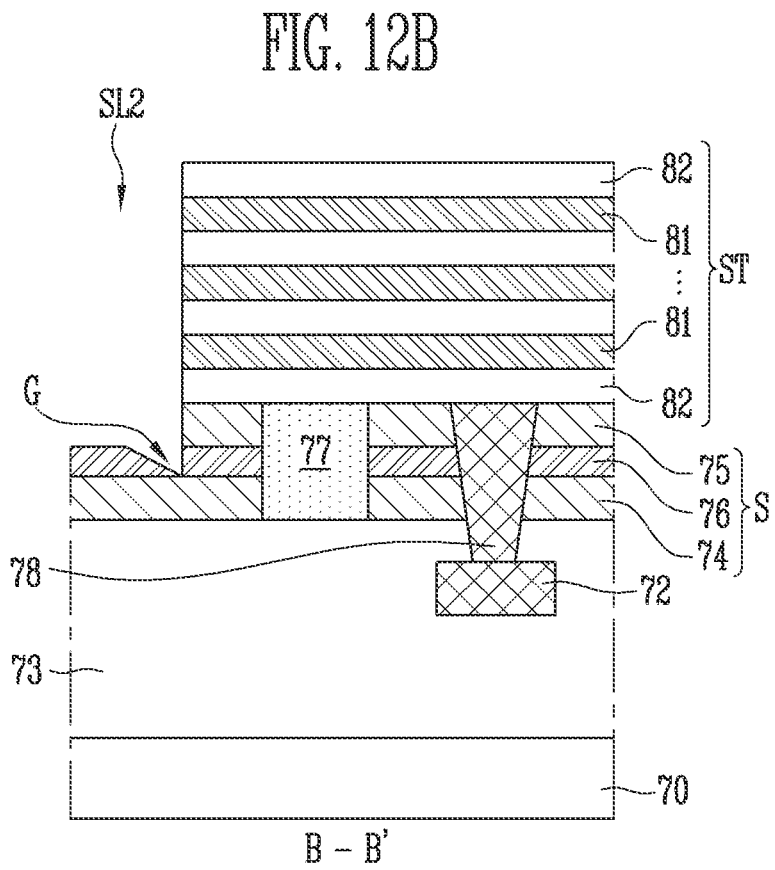

Referring to FIGS. 12A and 12B, an interconnection structure and an interlayer insulating layer 73 are formed on a base 70. The base 70 may include a substrate, a peripheral circuit, and the like. The interconnection structure may include a first contact plug 71, a line 72, and the like. The interconnection structure may be formed in the interlayer insulating layer 73, and be electrically connected to the base 70. For example, the first contact plug 71 may be electrically connected to the peripheral circuit, the substrate, and the like. The interlayer insulating layer 73 may be a single layer or a multi-layer.

Subsequently, a source structure S may be formed on the interlayer insulating layer 73. The source structure S may include at least one of a first source layer 74, a second source layer 75, and a sacrificial layer 76. Subsequently, isolation layers 77 are formed which penetrate the source structure S. The isolation layers 77 may be located to be spaced apart from each other a second direction II, and extend in a first direction I. The isolation layer 77 may include an insulating material such as oxide or nitride.

Subsequently, a second contact plug 78 may be formed which penetrates the source structure S. The second contact plug 78 is connected to the line 72. The source structure S may be electrically connected to the base 70 or the peripheral circuit through the second contact plug 78, the line 72, and the first contact plug 71.

Subsequently, a stack structure ST may be formed on the source structure S and the isolation layer 77. The stack structure ST may include first material layers 81 and second material layers 82, which are stacked in an alternating manner. The first material layers 81 may include a material with a high etch selectivity compared to the second material layers 82.

Subsequently, a first slit SL1 or a second slit SL2 may be formed which penetrates the stack structure ST. The second slit SL2 may have a depth to which the second slit SL2 exposes the source structure S. The second slit SL2 may be formed by performing an etching process to, as a target depth, a depth to which the second slit SL2 exposes the sacrificial layer 76. When the second slit SL2 may be formed, a groove G may be formed in a partial region, and the first source layer 74 may be exposed through the groove G.

The first slit SL1 may be spaced apart from the second contact plug 78 in the first direction I. The second slit SL2 may be adjacent to the second contact plug 78 in the second direction II. The second contact plug 78 may be located between second slits SL2 adjacent to each other in the second direction II.

On a plane defined by the first direction I and the second direction II, the first slit SL1 and the second slit SL2 may be spaced apart from each other by a first distance D1 in the second direction II. On the plane, an edge of the isolation layer 77 and the second contact plug 78 may be spaced apart from each other by a third distance D3. The third distance D3 may be a distance from the edge of the isolation layer 77 to an edge of the second contact plug 78. The third distance D3 may have a value greater than that of the first distance D. The third distance D3 may be twice or more of the first distance D1.

Figure 12C:
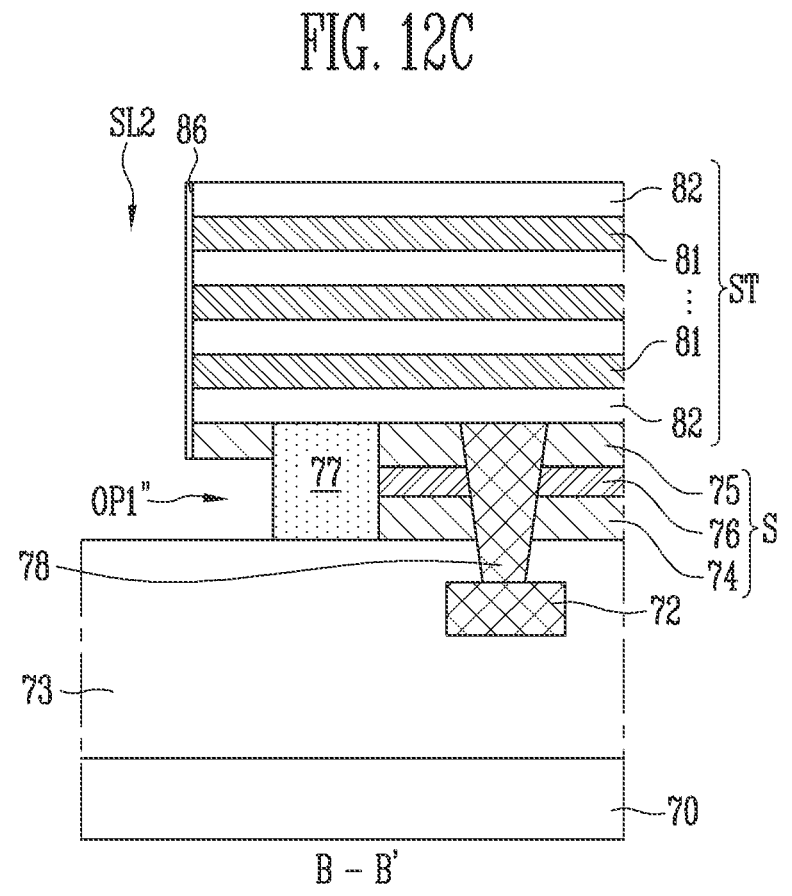

Referring to FIGS. 12A and 12C, a protective layer 86 may be formed on an inner wall of the first slit SL1 or the second slit SL2. Subsequently, a first opening OP1" may be formed by selectively etching the sacrificial layer 76 through the first slit SL1 or the second slit SL2. However, the isolation layer 77 exists in a region in which the second contact plug 78 and the second slit SL2 are adjacent to each other. Therefore, the shortest distance at which an etching composition reaches the second contact plug 78 from the second slit SL2 may be increased by the isolation layer 77. In addition, since the edge of the isolation layer 77 and the second contact plug 78 are spaced apart from each other by a sufficient distance, e.g., the third distance D3, the sacrificial layer 76 at the periphery of the second contact plug 78 may be prevented from being etched. Thus, the second contact plug 78 may avoid being exposed in the process of etching the sacrificial layer 76.

Subsequently, as described with reference to FIG. 7C, the first memory layer 53 that is exposed through the first opening OP1 is etched. Accordingly, the channel layer may be exposed.

Figure 12D:
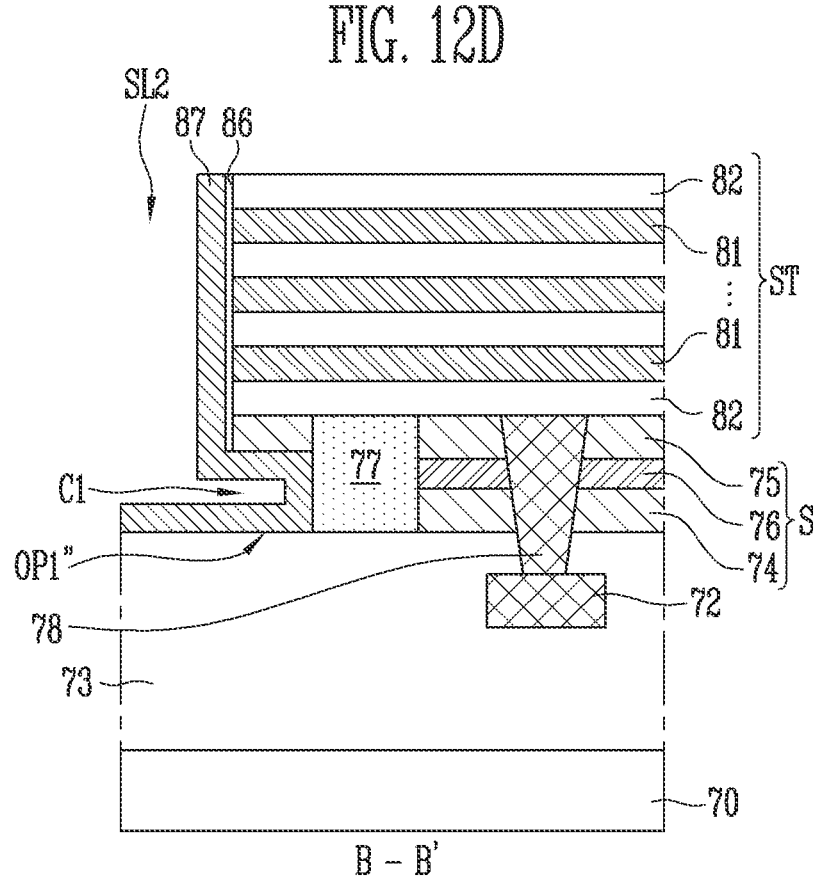

Referring to FIGS. 12A and 12D, a conductive layer 87 may be formed. The conductive layer 87 may be formed in the first opening OP1" and the second slit SL2. The conductive layer 87 may be formed to a thickness without completely filling the first opening OP1" and the second slit SL2. The conductive layer 87 may include a first cavity C1 that is located in the first opening OP1". The conductive layer 87 may include a conductive material, such as poly-silicon or metal.

Figure 12E:
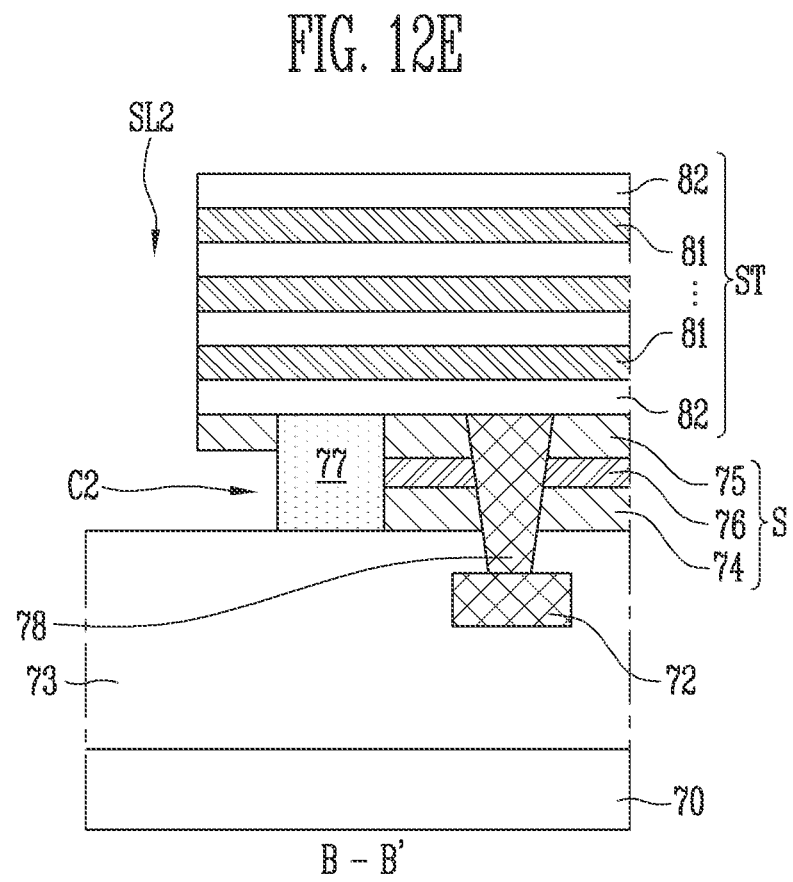

Referring to FIGS. 12A and 12E, the conductive layer 78 that is formed in the second slit SL2 may be etched. The etching speed at the periphery of the first cavity C1 may be increased by an etching composition that is introduced through the first cavity C1 during the etching process. Therefore, the conductive layer 87 at the periphery of the first cavity C1 may be removed, and a second cavity C2 may be formed in the source structure S. The second cavity C2 may expose the isolation layer 77 and might not extend up to the second contact plug 78. Thus, the second contact plug 78 might not be exposed through the second cavity C2. Subsequently, the protective layer 86 may be removed.

Figure 12F:
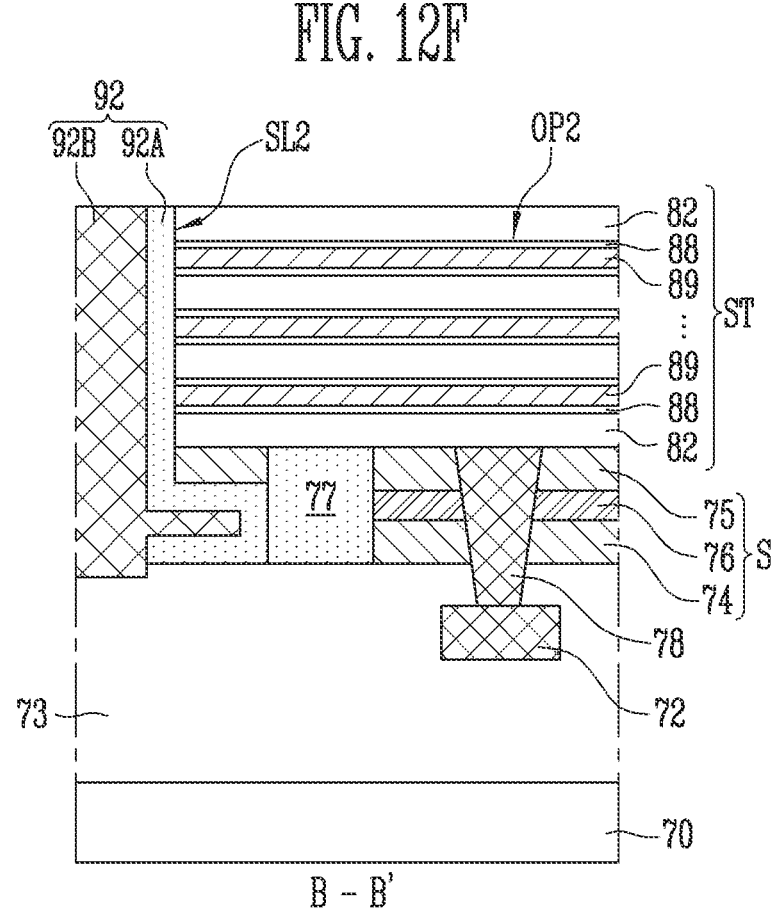

Referring to FIGS. 12A and 12F, the first material layers 81 may be replaced with conductive layers 89. Before the conductive layers 89 are formed, second memory layers 88 may be additionally formed. Each of the second memory layers 88 may include at least one of a tunnel insulating layer, a data storage layer, and a blocking layer. The blocking layer may include aluminum oxide ($Al_2O_3$). In addition, a heat treatment process may be performed after the blocking layer is formed in second openings OP2. Since the second contact plug 78 is not exposed through the second cavity C2, the second contact plug 78 might not be oxidized or damaged even when the heat treatment process is performed.

Subsequently, a second slit structure 92 may be formed in the second slit SL2. The second slit structure 92 may be formed by filling the second slit SL2 with an insulating material. Alternatively, after an insulating spacer 92A is formed on a sidewall of the second slit SL2, a source contact structure 92B that is electrically connected to the source structure S may be formed by filling the second slit SL2 with a conductive material so that the second slit structure 92 may be formed. The second slit structure 92 may be formed in the second cavity C2 and may be in contact with the isolation layer 77.

According to the manufacturing method described above, the groove G may be formed in the process of forming the second slit SL2. In addition, the second cavity C2 may be formed in the source structure S in a manufacturing process of the semiconductor device. However, since the second cavity C2 and the second contact plug 78 are spaced apart from each other by the isolation layer 77, the second contact plug 78 may avoid being exposed and damaged in the manufacturing process.

Figure 13:
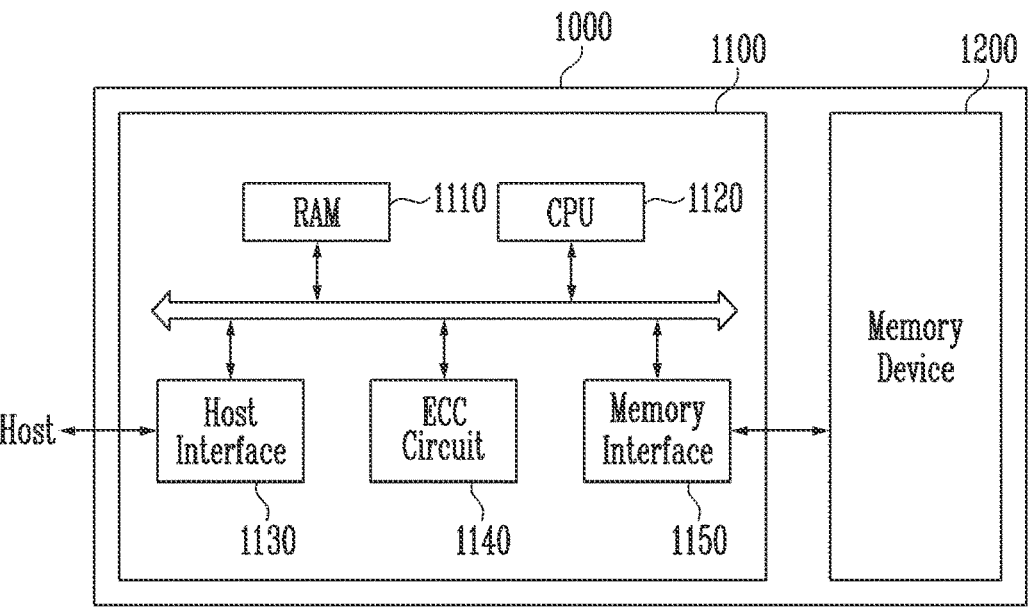
FIG. 13 is a block diagram, illustrating a configuration of a memory system, in accordance with an embodiment of the present disclosure.

FIG. 13 is a block diagram, illustrating a configuration of a memory system, in accordance with an embodiment of the present disclosure.

Referring to FIG. 13, the memory system 1000 includes a memory device 1200 and a controller 1100.

The memory device 1200 may be used to store data information with various data formats, such as texts, graphics, and software codes. The memory device 1200 may be a nonvolatile memory. Also, the memory device 1200 may have structures that are described with reference to FIGS. 1A to 12F and may be manufactured according to the manufacturing methods described with reference to FIGS. 1A to 12F. In an embodiment, the memory device 1200 may include: a line; a source structure on the line; a stack structure on the source structure; a first slit structure penetrating the stack structure; and a contact plug adjacent to the first slit structure in a first direction; a second slit structure penetrating the stack structure, the second slit structure being adjacent to the first slit structure in a second direction that is perpendicular to the first direction, wherein the contact plug penetrating the source structure, the contact plug being electrically connected to the lower line, wherein the first slit structure and the second slit structure are spaced apart from each other by a first distance in second direction, the first slit structure and the contact plug are spaced apart from each other by a second distance in the first direction, and the second distance is longer than the first distance. The structure and manufacturing method of the memory device 1200 are the same as described above, and therefore, their detailed descriptions will be omitted.

The controller 1100 may be connected to a host and the memory device 1200, and accesses the memory device 1200 in response to a request from the host. For example, the controller 1100 may be configured to control reading, writing, erasing, and background operations of the memory device 1200.

The controller 1100 may include a random access memory (RAM) 1110, a central processing unit (CPU) 1120, a host interface 1130, an error correction code (ECC) circuit 1140, a memory interface 1150, and the like.

The RAM 1110 may be used as a working memory of the CPU 1120, a cache memory between the memory device 1200 and the host, and a buffer memory between the memory device 1200 and the host. The RAM 1110 may be replaced with a static random access memory (SRAM), a read only memory (ROM), etc.

The CPU 1120 may control overall operations of the controller 1100. For example, the CPU 1120 may be configured to operate firmware, such as a flash translation layer (FTL) stored in the RAM 1110.

The host interface 1130 may be configured to interface with the host. For example, the controller 1100 may communicate with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 may be configured to detect and correct an error included in data that is read from the memory device 1200, using an error correction code (ECC).

The memory interface 1150 may be configured to interface with the memory device 1200. For example, the memory interface 1150 may include an NAND interface or NOR interface.

The controller 1100 may further include a buffer memory (not shown) for temporarily storing data. The buffer memory may be used to temporarily store data that is transferred to the outside through the host interface 1130 or data that is transferred from the memory device 1200 through the memory interface 1150. The controller 1100 may further include a ROM that stores code data for interfacing with the host.

As described above, the memory system 1000 may include the memory device 1200 with an improved degree of integration and improved characteristics, and thus, the degree of integration and characteristics of the memory system 1000 may be improved.

Figure 14:
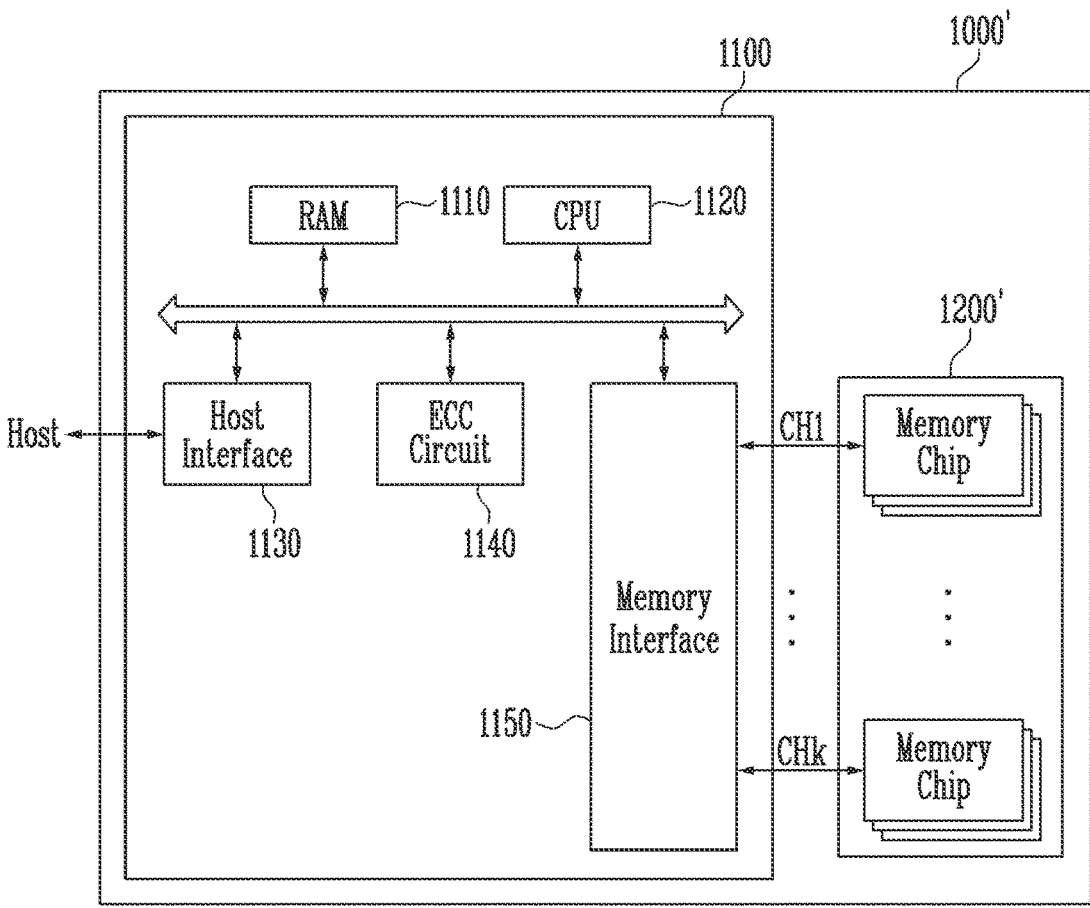
FIG. 14 is a block diagram, illustrating a configuration of a memory system, in accordance with an embodiment of the present disclosure.

FIG. 14 is a block diagram, illustrating a configuration of a memory system, in accordance with an embodiment of the present disclosure. Hereinafter, contents overlapping with those described above will be omitted.

Referring to FIG. 14, the memory system 1000' may include a memory device 1200' and a controller 1100. The controller 1100 may include a RAM 1110, a CPU 1120, a host interface 1130, an ECC circuit 1140, a memory interface 1150, and the like.

The memory device 1200' may be a nonvolatile memory. Also, the memory device 1200' may have structures, described with reference to FIGS. 1A to 12F, and may be manufactured according to the manufacturing methods that are described with reference to FIGS. 1A to 12F. In an embodiment, the memory device 1200' may include: a line; a source structure on the line; a stack structure on the source structure; a first slit structure penetrating the stack structure; and a contact plug adjacent to the first slit structure in a first direction; a second slit structure penetrating the stack structure, the second slit structure being adjacent to the first slit structure in a second direction that is perpendicular to the first direction, wherein the contact plug penetrating the source structure, the contact plug being electrically connected to the lower line, wherein the first slit structure and the second slit structure are spaced apart from each other by a first distance in second direction, the first slit structure and the contact plug are spaced apart from each other by a second distance in the first direction, and the second distance is longer than the first distance. The structure and manufacturing method of the memory device 1200' may be the same as described above, and therefore, their detailed descriptions will be omitted.

The memory device 1200' may be a multi-chip package with a plurality of memory chips. The plurality of memory chips may be divided into a plurality of groups, which are configured to communicate with the controller 1100 over first to kth channels (CH1 to CHk). In addition, memory chips with in one group may be configured to communicate with the controller 1100 over a common channel. For reference, the memory system 1000' may be modified such that one memory chip is connected to one channel.

As described above, the memory system 1000' may include the memory device 1200' with an improved degree of integration and improved characteristics, and thus the degree of integration and characteristics of the memory system 1000' may be improved. Particularly, the memory device 1200' may be configured as a multi-chip package so that the data storage capacity of the memory system 1000' may be increased, and the operation speed of the memory system 1000' may be improved.

Figure 15:
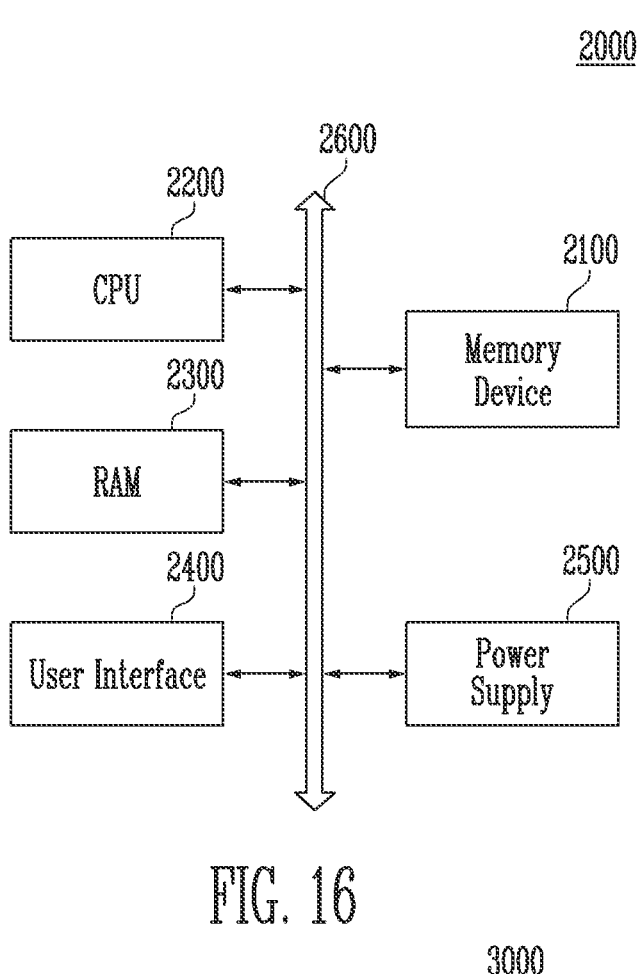
FIG. 15 is a block diagram, illustrating a configuration of a computing system, in accordance with an embodiment of the present disclosure.

FIG. 15 is a block diagram, illustrating a configuration of a computing system, in accordance with an embodiment of the present disclosure. Hereinafter, contents overlapping with those described above will be omitted.

Referring to FIG. 15, the computing system 2000 may include a memory device 2100, a CPU 2200, a RAM 2300, a user interface 2400, a power supply 2500, a system bus 2600, and the like.

The memory device 2100 may store data that is provided through the user interface 2400, data processed by the CPU 2200, and the like. In addition, the memory device 2100 may be electrically connected to the CPU 2200, the RAM 2300, the user interface 2400, the power supply 2500, and the like through the system bus 2600. For example, the memory device 2100 may be directly connected to the system bus 2600 or may be connected through a controller (not shown). When the memory device 2100 is directly connected to the system bus 2600, a function of the controller may be performed by the CPU 2200, the RAM 2300, etc.

The memory device 2100 may be a nonvolatile memory. The memory device 2100 may have structures described with reference to FIGS. 1A to 12F, and be manufactured according to the manufacturing methods described with reference to FIGS. 1A to 12F. In an embodiment, the memory device 2100 may include: a line; a source structure on the line; a stack structure on the source structure; a first slit structure penetrating the stack structure; and a contact plug adjacent to the first slit structure in a first direction; a second slit structure penetrating the stack structure, the second slit structure being adjacent to the first slit structure in a second direction that is perpendicular to the first direction, wherein the contact plug penetrating the source structure, the contact plug being electrically connected to the lower line, wherein the first slit structure and the second slit structure are spaced apart from each other by a first distance in second direction, the first slit structure and the contact plug are spaced apart from each other by a second distance in the first direction, and the second distance is longer than the first distance. The structure and manufacturing method of the memory device 2100 may be the same as described above, and therefore, their detailed descriptions will be omitted.

The memory device 2100 may be a multi-chip package with a plurality of memory chips as described with reference to FIG. 5.

The computing system 2000, configured as described above, may be a computer, an ultra-mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As described above, the computing system 2000 may include the memory device 2100 with an improved degree of integration and improved characteristics, and thus, characteristics of the computing system 2000 may also be improved.

Figure 16:
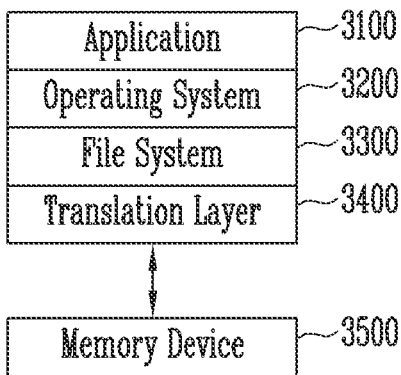
FIG. 16 is a block diagram, illustrating a configuration of a computing system, in accordance with an embodiment of the present disclosure.

FIG. 16 is a block diagram, illustrating a configuration of a computing system, in accordance with an embodiment of the present disclosure.

Referring to FIG. 16, the computing system 3000 may include a software layer with an operating system 3200, an application 3100, a file system 3300, a translation layer 3400, and the like. In addition, the computing system 3000 may include a hardware layer of a memory device 3500, etc.

The operating system 3200 may manage software resources, hardware resources, etc. of the computing system 3000, and control program execution of a central processing unit. The application 3100 may be one of a variety of application programs that run on the computing system 3000 and may be a utility that is executed by the operating system 3200.

The file system 3300 is defined as a logical structure for managing data, files, etc. in the computing system 3000, and organizes the data or files stored in the memory device 3500 according to a rule. The file system 3300 may be determined based on the operating system 3200 that is used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

Referring to FIG. 16, the operating system 3200, the application 3100, and the file system 3300 are shown as individual blocks. However, the application 3100 and the file system 3300 may be included in the operating system 3200.

The translation layer 3400 may translate an address into a form that is suitable for the memory device 3500 in response to a request from the file system 3300. For example, the translation layer 3400 may translate a logical address that is generated by the file system 3300 into a physical address of the memory device 3500. Mapping information between the logical address and the physical address may be stored as an address translation table. For example, the translation layer 3400 may be a flash translation layer (FTL), a universal flash storage link layer (ULL), etc.

The memory device 3500 may be a nonvolatile memory. The memory device 3500 may have structures that are described with reference to FIGS. 1A to 12F and may be manufactured according to the manufacturing methods described with reference to FIGS. 1A to 12F. In an embodiment, the memory device 3500 may include: a line; a source structure on the line; a stack structure on the source structure; a first slit structure penetrating the stack structure; and a contact plug adjacent to the first slit structure in a first direction; a second slit structure penetrating the stack structure, the second slit structure being adjacent to the first slit structure in a second direction that is perpendicular to the first direction, wherein the contact plug penetrating the source structure, the contact plug being electrically connected to the lower line, wherein the first slit structure and the second slit structure are spaced apart from each other by a first distance in second direction, the first slit structure and the contact plug are spaced apart from each other by a second distance in the first direction, and the second distance is longer than the first distance. The structure and manufacturing method of the memory device 3500 may be the same as described above, and therefore, their detailed descriptions will be omitted.

The computing system 3000, configured as described above, may be divided into an operating system layer that is performed in an upper level region and a controller layer that is performed in a lower level region. The application 3100, the operating system 3200, and the file system 3300 may be included in the operating system layer and may be driven by a working memory of the computing system 3000. In addition, the translation layer 3400 may be included in the operating system layer or the controller layer.

As described above, the computing system 3000 may include the memory device 3500 with an improved degree of integration and improved characteristics, and thus, characteristics of the computing system 3000 may also be improved.

In accordance with the present disclosure, a semiconductor device with a stable structure and improved reliability may be provided. Further, when the semiconductor device is manufactured, the level of difficulty of the processes may be lowered, manufacturing procedures may be simplified, and manufacturing cost may be reduced.

The exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:
1. A method of manufacturing a semiconductor device, the method comprising:
    forming a line;
    forming a source structure over the line, wherein the source structure includes a sacrificial layer and a first source layer;
    forming a contact plug that penetrates the source structure, the contact plug being electrically connected to the line;
    forming a stack structure over the source structure and the contact plug;
    forming a first slit that penetrates the stack structure, extends in a first direction, and is adjacent to the contact plug in the first direction;
    forming a second slit that penetrates the stack structure and is adjacent to the first slit in a second direction intersecting the first direction; and

replacing the sacrificial layer of the source structure with a second source layer through the first slit,
    wherein the first slit and the second slit are spaced apart from each other by a first distance, the first slit and the contact plug are spaced apart from each other by a second distance, and
    wherein the second distance is longer than the first distance.
2. The method of claim 1, wherein, when the sacrificial layer is replaced with the second source layer through the first slit, a cavity is formed in the source structure, and
    wherein the contact plug is spaced apart from the cavity.
3. The method of claim 1, wherein the replacing of the sacrificial layer with the second source layer comprises:
    forming an opening by removing the sacrificial layer;
    forming a conductive layer in the opening and the first slit; and
    forming the second source layer by etching the conductive layer formed in the first slit.
4. The method of claim 3, wherein the conductive layer includes a first cavity that is located in the opening, and
    wherein a second cavity is formed in the source structure by etching the conductive layer at the periphery of the first cavity when the conductive layer is etched.
5. The method of claim 4, wherein the contact plug is spaced apart from the second cavity.
6. The method of claim 1, wherein the second distance is twice as long as or more than twice as long as the first distance.
7. The method of claim 1, further comprising forming a slit structure that penetrates the stack structure before the first slit is formed,
    wherein the first slit intersects the slit structure.
8. The method of claim 1, further comprising:
    forming an isolation layer that penetrates the source structure before the stack structure is formed; and
    replacing the sacrificial layer with the second source layer through the second slit,
    wherein the isolation layer is located between the second slit and the contact plug.
9. The method of claim 8, wherein the isolation layer includes an insulating material.
10. The method of claim 8, wherein, when the sacrificial layer is replaced with the second source layer through the second slit, a cavity is formed in the source structure, and
    wherein the contact plug is spaced apart from the cavity.
11. The method of claim 8, wherein the isolation layer includes an edge adjacent to the first slit and the edge of the isolation layer and the contact plug are spaced apart from each other by a third distance, and
    wherein the third distance is longer than the first distance.
12. The method of claim 11, wherein the third distance is twice as long as or more than twice as long as the first distance.
13. The method of claim 1, wherein the contact plug is a discharge contact plug.

* * * * *